United States Patent
Lin et al.

(10) Patent No.: US 10,498,366 B2
(45) Date of Patent: *Dec. 3, 2019

(54) DATA DEPENDENCY MITIGATION IN PARALLEL DECODERS FOR FLASH STORAGE

(71) Applicant: SK Hynix Inc., Gyeonggi-do (KR)

(72) Inventors: Yi-Min Lin, San Jose, CA (US); Aman Bhatia, San Jose, CA (US); Naveen Kumar, San Jose, CA (US); Johnson Yen, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 37 days.

This patent is subject to a terminal disclaimer.

(21) Appl. No.: 15/582,278

(22) Filed: Apr. 28, 2017

(65) Prior Publication Data

US 2017/0373706 A1    Dec. 28, 2017

Related U.S. Application Data

(60) Provisional application No. 62/354,002, filed on Jun. 23, 2016.

(51) Int. Cl.
  *H03M 13/29*  (2006.01)
  *H03M 13/27*  (2006.01)
  (Continued)

(52) U.S. Cl.
  CPC ..... *H03M 13/2909* (2013.01); *H03M 13/271* (2013.01); *H03M 13/2927* (2013.01);
  (Continued)

(58) Field of Classification Search
  CPC ........... H03M 13/2909; H03M 13/152; H03M 13/1545; H03M 13/6561; H03M 13/2927;
  (Continued)

(56) References Cited

U.S. PATENT DOCUMENTS 4,617,664 A   10/1986   Aichelmann, Jr. et al.
5,477,551 A   12/1995   Parks et al.
(Continued)

OTHER PUBLICATIONS

Jorn Justesen, "Performance of Product Code and Related Structures with Iterated Decoding," IEEE Transactions on Communication, vol. 59, No. 2, Feb. 2011, 9 pages.
(Continued)

*Primary Examiner* — Guy J Lamarre
(74) *Attorney, Agent, or Firm* — Kilpatrick Townsend & Stockton LLP

(57) ABSTRACT

A memory device can include a memory array, a processor coupled to the memory array, and a decoding apparatus. The decoding apparatus is configured to perform parallel decoding of codewords. Each of the codewords has a plurality of data blocks, each data block having a number of data bits. The decoding apparatus is configured to decode in parallel two or more codewords, which share a common data block, to determine error information associated with each codeword. For each error, the error information identifies a data block having the and associated error bit patterns. The decoding apparatus is configured to update the two or more codewords based on the identified data blocks having errors and the associated error bit patterns.

20 Claims, 15 Drawing Sheets

(51) Int. Cl.
*H03M 13/37* (2006.01)
*H03M 13/00* (2006.01)
*H03M 13/15* (2006.01)

(52) U.S. Cl.
CPC ... *H03M 13/3707* (2013.01); *H03M 13/3746* (2013.01); *H03M 13/6561* (2013.01); *H03M 13/152* (2013.01); *H03M 13/1545* (2013.01)

(58) Field of Classification Search
CPC ......... H03M 13/3707; H03M 13/3746; H03M 13/271
See application file for complete search history.

(56) References Cited

U.S. PATENT DOCUMENTS

| | | | |
|---|---|---|---|
| 5,517,514 A | | 10/1996 | Norrie et al. |
| 6,047,395 A | * | 4/2000 | Zook .................. G11B 20/1833 714/755 |
| 6,052,815 A | | 4/2000 | Zook |
| 7,356,752 B2 | | 4/2008 | Hewitt et al. |
| 8,156,400 B1 | * | 4/2012 | Yeo ....................... H03M 5/145 714/758 |
| 8,468,430 B2 | | 1/2013 | Shin |
| 8,429,498 B1 | | 4/2013 | Anholt et al. |
| 8,887,020 B2 | | 11/2014 | Shokrollahi |
| 9,231,623 B1 | | 1/2016 | Kumar |
| 9,559,727 B1 | | 1/2017 | Kumar et al. |
| 9,998,148 B2 | | 6/2018 | Kumar et al. |
| 2001/0050622 A1 | * | 12/2001 | Hewitt ............... H03M 13/2903 341/50 |
| 2002/0007474 A1 | | 1/2002 | Fujita et al. |
| 2004/0025106 A1 | * | 2/2004 | Massey ............. H03M 13/2957 714/786 |
| 2004/0054651 A1 | | 3/2004 | Katayama et al. |
| 2008/0134004 A1 | | 6/2008 | Park et al. |
| 2010/0088575 A1 | | 4/2010 | Sharon et al. |
| 2010/0199149 A1 | | 8/2010 | Weingarten et al. |
| 2011/0258514 A1 | * | 10/2011 | Lasser ................. G06F 11/1012 714/763 |
| 2012/0317460 A1 | | 12/2012 | Chilappagari et al. |
| 2014/0095960 A1 | * | 4/2014 | Chu .................... H03M 13/152 714/763 |
| 2014/0129896 A1 | | 5/2014 | Sivagnanam Parhasarathy et al. |
| 2014/0129899 A1 | | 5/2014 | Kumar et al. |
| 2015/0309869 A1 | * | 10/2015 | Mittelholzer ....... G06F 11/1012 714/764 |
| 2015/0309875 A1 | | 10/2015 | Mittelholzer et al. |
| 2016/0142075 A1 | * | 5/2016 | Maehata ............ H03M 13/1111 714/752 |
| 2016/0285478 A1 | * | 9/2016 | Fujiwara ........... H03M 13/2909 |
| 2016/0342467 A1 | | 11/2016 | Kumar et al. |
| 2017/0222662 A1 | * | 8/2017 | Kumar ............... H03M 13/2927 |
| 2017/0257121 A1 | | 9/2017 | Kwok |
| 2017/0279468 A1 | * | 9/2017 | Kumar ............... H03M 13/2909 |
| 2017/0331500 A1 | * | 11/2017 | Bhatia ............... H03M 13/2942 |

OTHER PUBLICATIONS

Non-Final Office Action for U.S. Appl. No. 15/411,773, dated Oct. 30, 2018, 36 pages.
Non-Final Office Action for U.S. Appl. No. 15/158,425, dated Mar. 21, 2018, 11 pages.
Final Office Action for U.S. Appl. No. 15/158,425, dated Oct. 15, 2018, 9 pages.
Notice of Allowance for U.S. Appl. No. 15/158,425, dated Dec. 18, 2018, 5 pages.
Non-Final Office Action for U.S. Appl. No. 15/460,155, dated Oct. 16, 2018, 10 pages.
Restriction Requirement for U.S. Appl. No. 15/460,155 dated May 2, 2018, 6 pages.
Non-Final Office Action for 15/668,565 dated Jan. 11, 2019, 11 pages.
Sklar, et al., "The ABCs of linear block codes", IEEE Signal Processing Magazine, vol. 21, Issue 4, Jul. 19, 2004, pp. 14-35.
Therattil, et al., "A Low-complexity Soli-decision Decoder for Extended BCH and RS-Like Codes", In Proc. IEEE Int. Symp. Inf. Theory, Sep. 2005, pp. 1320-1324.
U.S. Appl. No. 15/411,773, "Notice of Allowance", dated May 28, 2019, 17 pages.
U.S. Appl. No. 15/460,155, "Final Office Action", dated May 1, 2019, 8 pages.
U.S. Appl. No. 15/668,565, "Ex Parte Quayle Action", dated May 1, 2019, 6 pages.
U.S. Appl. No. 15/158,425, "Notice of Allowance", dated Apr. 19, 2019, 5 pages.

* cited by examiner

DATA DEPENDENCY MITIGATION IN PARALLEL DECODERS FOR FLASH STORAGE

CROSS-REFERENCES TO RELATED APPLICATIONS

The present application claims priority to U.S. Provisional Application No. 62/354,002, entitled "An Improved Data Dependency Mitigation Scheme For Generalized Product Codes," filed Jun. 23, 2016, commonly assigned and expressly incorporated by reference herein in its entirety.

This application is also a continuation-in-part application of U.S. patent application Ser. No. 15/411,773, entitled "Data Dependency Mitigation In Decoder Architecture For Generalized Product Codes," filed Jan. 20, 2017, which claims priority to U.S. Provisional Application No. 62/290,749, entitled "Data Dependency Mitigation In Decoder Architecture For Generalized Product Codes," filed Feb. 3, 2016, and U.S. Provisional Application No. 62/354,002, entitled "An Improved Data Dependency Mitigation Scheme For Generalized Product Codes," filed Jun. 23, 2016, all of which are commonly assigned and expressly incorporated by reference herein in their entirety.

This application is also related to U.S. patent application Ser. No. 15/158,425 entitled "Generalized Product Codes For NAND Flash Storage," filed May 18, 2016, which is commonly assigned and expressly incorporated by reference herein in its entirety.

BACKGROUND

The term "error correcting code (ECC)" is used herein to refer to a process of adding redundant data, or parity data, to a message, such that it can be recovered by a receiver even when a number of errors were introduced, either during the process of transmission, or storage. In general, the ECC can correct the errors up to the capability of the code being used. Error-correcting codes are frequently used in communications, as well as for reliable storage in media such as CDs, DVDs, hard disks, and random access memories (RAMs), flash memories, solid state disk (SSD), and the like.

In NAND flash storage enterprise applications, high read throughput is a relevant feature. Read latency can be reduced significantly if the ECC decoder is able to decode the data using a single read from the NAND media (hard decoding). This motivated the ECC researchers to improve performance for the hard decoding. With recent research findings for product codes, it has been confirmed that this class of codes provides better decoding performance compared to Bose-Chaudhuri-Hocquenghem (BCH) and low density parity check (LDPC) codes with a low complexity encoder/decoder when a single NAND read operation is performed.

A class of improved product codes has been proposed, as described in U.S. patent application Ser. No. 15/158,425 entitled "Generalized Product Codes For NAND Flash Storage," filed May 18, 2016, which is commonly assigned and expressly incorporated by reference herein in its entirety. This class of improved product codes, referred to as generalized product codes (GPC), has been shown to provide improved performance, for example, lower error floor.

BRIEF SUMMARY OF THE DISCLOSURE

Product codes can have structures in which two codewords can share a common data block. For example, GPCs have a structure such that every pair of constituent codewords shares a certain number of data bits among each other (referred to as intersection of these codewords). If two decoders are operated in parallel to decode a pair of constituent codewords that share data bits, each decoder may try to correct bits in its intersection. This causes a clash in updating the errors in data bits, and the hardware implementation of this decoder may behave in an unpredictable manner. This data dependency among constituent codes is also problematic when single-constituent-decoder architecture with several pipeline stages is used. Moreover, this problem becomes severe when the number of component decoders that run in parallel is increased.

In embodiments of this disclosure, a decoder is configured to decode multiple constituent codewords in parallel to meet the desired throughput. The proposed decoder architecture mitigates the data dependency issue with minimal loss in the throughput compared with an upper bound obtained using an idealized hypothetical decoder. The decoder can be applied to any parallel decoding of constituent codewords that share at least one common data block, such as the parallel decoding of two constituent codewords from a GPC codeword or the parallel decoding of a row codeword and a column codeword from a TPC codeword. Further, the term "parallel decoding" refers to some overlap in the decoding time between two codewords. For example, the decoding of the first codeword can (or typically does) start before the decoding of the second codeword (and can end before it too).

According to some embodiments of the present disclosure, a memory device includes a memory array, a processor coupled to the memory array, and a decoding apparatus. The decoding apparatus is configured to perform coarse decoding and fine decoding. In some embodiments, the fine decoding is performed only if it is determined that coarse decoding has failed to decode the codewords successfully. In coarse decoding, the decoder decodes in parallel two or more codewords, which share a common block of bits, to determine error information. Next, the decoder corrects errors in a first codeword based on the error information. Then, it is determined if the shared common block of data bits is corrected. If the shared common data block is updated, then error correction based on the error information is prohibited in codewords sharing the common block of data bits with the first codeword. In fine decoding, a single codeword is decoded at a time for error correction.

According to some embodiments of the present disclosure, a decoding apparatus is configured for decoding a plurality of codewords in parallel. The apparatus includes a memory and a processor coupled to the memory. The processor is configured to read encoded data including a plurality of codewords, which is encoded in a product code in which each codeword has multiple blocks of data bits and every two codewords share a common block with each other. One or more decoders are configured to perform parallel decoding of two or more codewords. The apparatus is configured to perform coarse decoding and fine decoding. In some embodiments, the fine decoding is performed only if it is determined that coarse decoding has failed to decode the codewords successfully. In the coarse decoding, the apparatus is configured to perform parallel decoding of two or more codewords to determine error information, and update a first codeword if the error information indicates that an error exists. The apparatus also determines if the common block between the first and second codewords is updated, and updates the second codeword based on the error information, unless the common block is updated in the decoding of the first codeword. In the fine decoding, the codewords are decoded one at a time.

According to some embodiments of the present disclosure, a method for decoding data includes reading, from a memory device, encoded data including a plurality of codewords. The method includes decoding in parallel two or more codewords that share a common block of data bits, to determine error information, and correcting errors in a first codeword based on the error information. The method also determines if the shared common block of data bits is corrected, and, if so determined, prevents error correction based on the error information in codewords sharing a common block of data bits with the first codeword. The method can also include decoding a single codeword at a time for error correction.

According to some embodiments of the present disclosure, a decoding apparatus configured for decoding a plurality of codewords in parallel can include a memory, a processor coupled to the memory, and one or more decoders configured to perform parallel decoding of two codewords. The processor is configured to read encoded data including a plurality of codewords from the memory. The plurality of codewords is encoded in a product code in which each codeword has multiple data blocks, and each data block has a number of data bits.

In some embodiments, the apparatus is configured to perform parallel decoding of first and second codewords sharing a common data block to determine error information associated with each codeword. In the parallel decoding of two codewords, the decoding of each codeword at least partially overlaps in time with the decoding of the other codeword. For every error, the error information identifies the data blocks having the error and associated error bit pattern. The decoding apparatus is configured to update the first codeword based on the error information indicating an error. If the error information indicates an error in the decoding of the second codeword, the decoding apparatus is configured to determine whether to update the second codeword as follows. First, the decoding apparatus determines if the common data block between the first codeword and the second codeword has been identified as having an error in the decoding of the first codeword. Upon determining that the common data block has not been identified as having an error, the decoding apparatus updates the second codeword based on the error information. Upon determining that the common data block has been identified as having an error and that an error bit pattern in the common data block identified in the decoding of the second codeword is the same as an error bit pattern in the common data block identified from the error information based on the decoding of the first codeword, the decoding apparatus updates data blocks other than the common data block in the second codeword without updating the common data block. Further, upon determining that the common data block has been identified as having an error and that the error bit pattern in the common data block identified in the decoding of the second codeword is different from the error bit pattern in the common data block identified from the error information based on the decoding of the first codeword, skip the updating of the second codeword. In the latter case, the error in the second codeword is not updated, and it can be processed in the next decoding step.

According to some embodiments of the present disclosure, a method for decoding data includes reading, from a memory, encoded data including a plurality of codewords. Each codeword has multiple data blocks and each data block includes a number of data bits. The method also includes decoding, in parallel, a first codewords and second codeword that share a common data block to determine error information associated with each codeword. In the parallel decoding of the first and second codewords, the decoding of the first codeword at least partially overlaps in time with the decoding of the second codeword. For each error, the error information identifies one or more data blocks having errors and associated error bit patterns. The method further includes updating the codewords based on the error information associated with the common data block.

According to some embodiments of the present disclosure, a memory device can include a memory array, a processor coupled to the memory array, and a decoding apparatus. The decoding apparatus is configured to perform parallel decoding of codewords. Each of the codewords has a plurality of data blocks, and each data block has a number of data bits. The decoding apparatus is configured to decode in parallel two or more codewords, which share at least a common data block, to determine error information associated with each codeword. For each error, the error information identifies a data blocks having the error and associated error bit pattern. The decoding apparatus is configured to update the two or more codewords based on the identified one or more data blocks having errors and the associated error bit patterns.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1A:
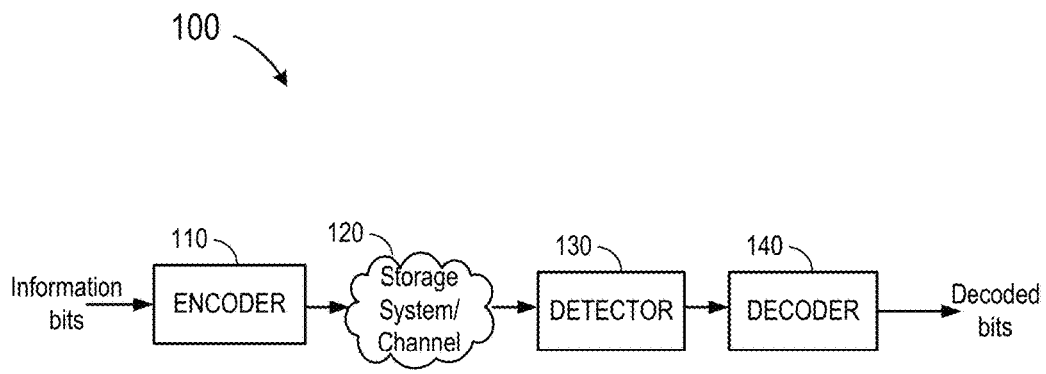
FIG. 1A is a simplified block diagram illustrating a data communication system in accordance with certain embodiments of the present disclosure.

FIG. 1A a simplified block diagram illustrating a data communication system 100 in accordance with certain embodiments of the present disclosure. In the example shown, encoder 110 receives information bits that include data which is desired to be stored in a storage system 120 or transmitted in a communications channel. The encoded data is output by encoder 110 and is written to storage 120. In various embodiments, storage 120 may include a variety of storage types or media such as (e.g., magnetic) disk drive storage, Flash storage, etc. In some embodiments, the techniques described herein are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), detector 130 receives the data from the storage system. The received data may include some noise or errors. Detector 130 performs detection on the received data and outputs decision and/or reliability information corresponding to one or more bits in a codeword. For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to decoder 140 which performs decoding using the decision and reliability information. A soft input decoder utilizes both the decision and the reliability information to decode the codeword. A hard decoder utilizes only the decision values in the decoder to decode the codeword. After decoding, the decoded bits generated by the decoder are passed to the appropriate entity (e.g., the user or application which requested it). With proper encoding and decoding, the information bits match the decoded bits.

Figure 1B:
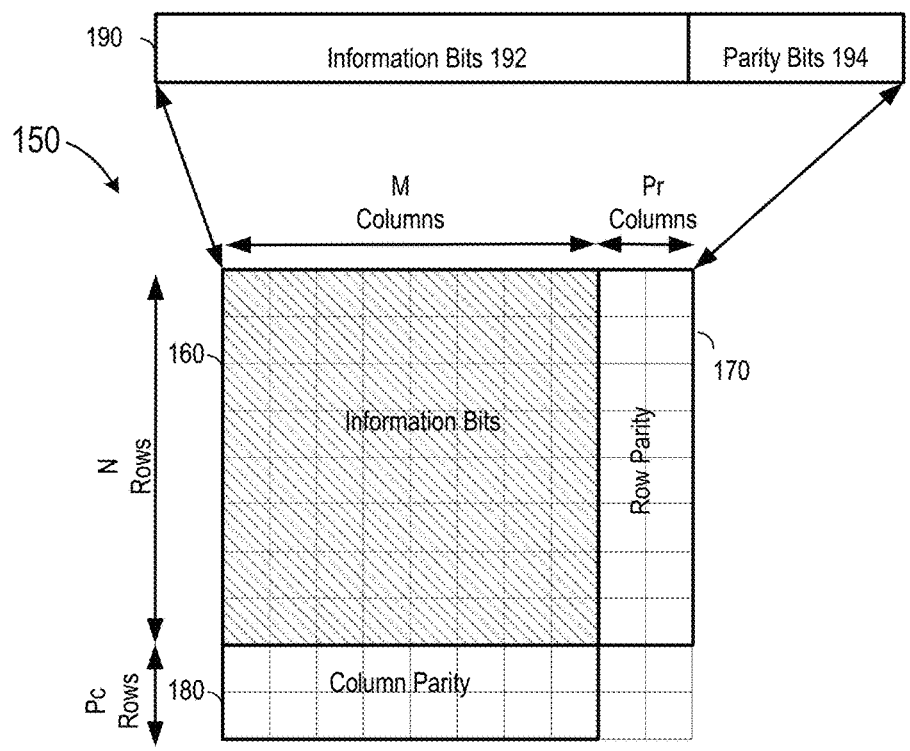
FIG. 1B is a simplified block diagram illustrating a conventional product code.

FIG. 1B a simplified block diagram illustrating a conventional product code. FIG. 1B illustrates a two-dimensional turbo product code (TPC) codeword 150. As illustrated, the TPC codeword 150 may be a matrix of size $(N+P_c) \times (M+P_r)$, in which N represents the number of rows of information bits, M represents the number of columns of information bits, $P_r$ represents the number of row parity bits and $P_c$ represents the number of column parity bits. Information bits can be represented by a matrix of size N×M (e.g., matrix 160), row parity bits can be represented by a matrix of size $N \times P_r$ (e.g., matrix 170), and Column parity bits may be represented by a matrix of size $P_c \times M$ (e.g., matrix 180). The TPC codeword may include N row codewords and M column codewords. Each row codeword 190 includes multiple information bits 192 and one or more parity bits 194. Similarly, each column codeword includes multiple information bits and one or more parity bits. As an example, if row constituent code is a BCH code, the row codewords 1 through N are constructed using BCH encoding. Similarly, column codewords 1 through M are generated using an error correcting constituent code (e.g., BCH code, Reed Solomon code, etc.).

As an example, if the row constituent code has a code rate of 0.9, the row codeword may include 90 information bits and 10 parity bits. In general, row codewords and column codewords may have any code rate, without departing from the teachings of the present disclosure. To obtain the row and column parity bits, a TPC encoder (not shown) first encodes the N rows of information bits (shown as shaded blocks) to generate the N row parity bit groups. Then, the TPC encoder encodes the M columns of information bits to generate the M column parity bit sets.

Figure 2A:
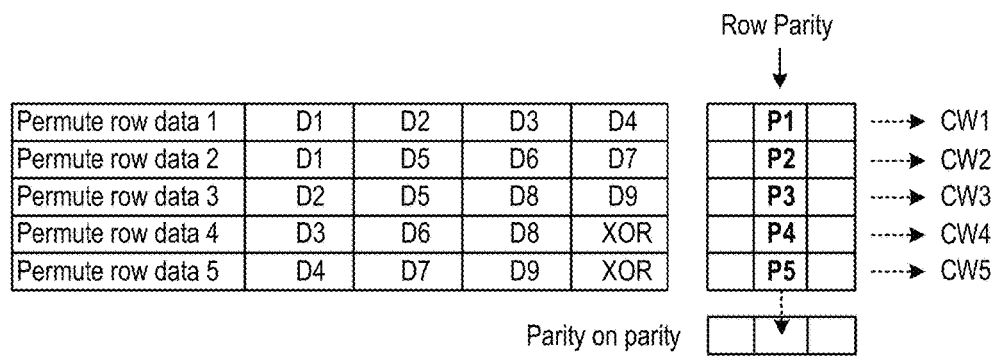
FIG. 2A is a simplified block diagram illustrating a generalized product code (GPC) in accordance with certain embodiments of the present disclosure.

FIGS. 2A-2H are simplified schematic diagrams illustrating a generalized product code (GPC) in accordance with certain embodiments of the present disclosure. As an example, a GPC is a product code in which information bits are grouped in blocks, the blocks of information bits and one or more XOR parity blocks arranged in a rectangular matrix of data blocks. In the example of FIG. 2A, the data blocks of information bits, also referred to as information blocks, are numbered D1-D9, and each block Dk contains I bits, where I is a positive integer. Each row of data is permuted and the codeword parity is constructed on the permuted data, which is shown as Row Parity in FIG. 2A. In addition, the parities on the parity (POP) are constructed by combining row parities column-wise. The arrangement is configured to remove miscorrections because the same codeword will not be formed for different rows with changing data locations with permutations. All the data blocks are protected twice; however, the row parity is protected once. The parity on parity (POP) will add another level of protection to remove errors in parities.

Figure 2B:
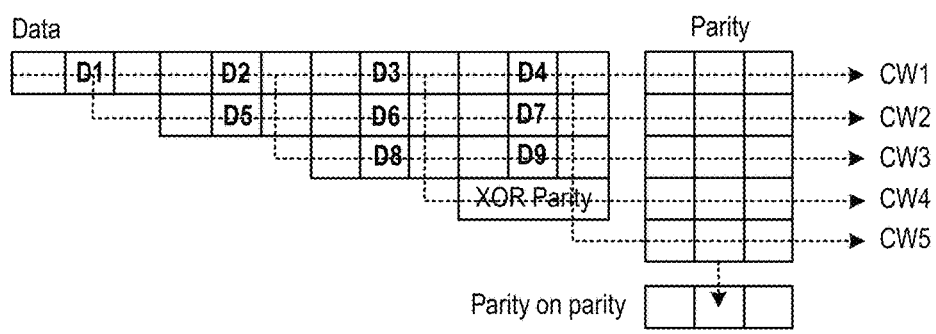
FIG. 2B is a simplified block diagram illustrating an exemplary construction of a generalized product code (GPC) in accordance with certain embodiments of the present disclosure.

In FIG. 2B, a specific example is shown to explain the construction of a GPC. However, the method described here can be used for any class of generalized product codes. For example, in other embodiments, the product code construction can be extended to higher dimensions. In an embodiment, data blocks can be protected three times in a three-dimensional generalized product code. In FIG. 2B, the number of data bits in a block, I, is taken as an integer, for example, from 8 to 16, but it can be any chosen value depending upon desired data length and code rate. Let Ncw be the number of row codewords, which is equal to five in FIG. 2B, i.e., there are five codewords designated as CW1-CW5. The block designated as "XOR" or "XOR parity" is constructed by taking XOR (exclusive OR) of all data blocks of length I, and the parities of the first (Ncw−1) row codewords. In some embodiments, multiple XOR blocks can be formed, with each XOR block constructed based on a subset of all data blocks of information bits. The length of the "XOR parity" block is also equal to I. All row parities are further encoded by another constituent code which is called parity on parity or POP. In this code construction, the decoding criterion is such that the data is decoded successfully if all Ncw codewords are decodable and XOR parity check is satisfied. This decoding criterion helps in avoiding miscorrections which can make a valid codeword in a regular TPC decoding criterion but it will not be a valid codeword with a modified decoding criterion. In this construction XOR is used to correct stuck patterns.

In this example, it can be seen that every pair of constituent codewords share a common block of data bits with each other. In other words, the same block of data is contained in two codewords. For instance, data block D1 is in both CW1 and CW2, and therefore, CW1 and CW2 share data block D1. Similarly, CW1 and CW3 share data block D2, CW1 and CW4 share data block D3, and CW1 and CW4 share data block D4. Further, CW2 and CW3 share data block D5, CW3 and CW4 share data block D8, and CW4 and CW5 share the XOR data block, etc.

Figure 2C:
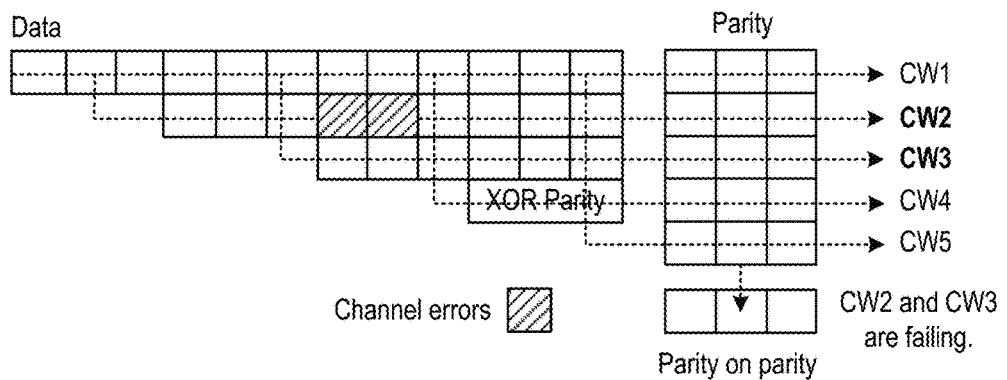
FIGS. 2C-2G are simplified block diagrams illustrating error correction examples in a generalized product code (GPC) in accordance with certain embodiments of the present disclosure.
Figure 2D:
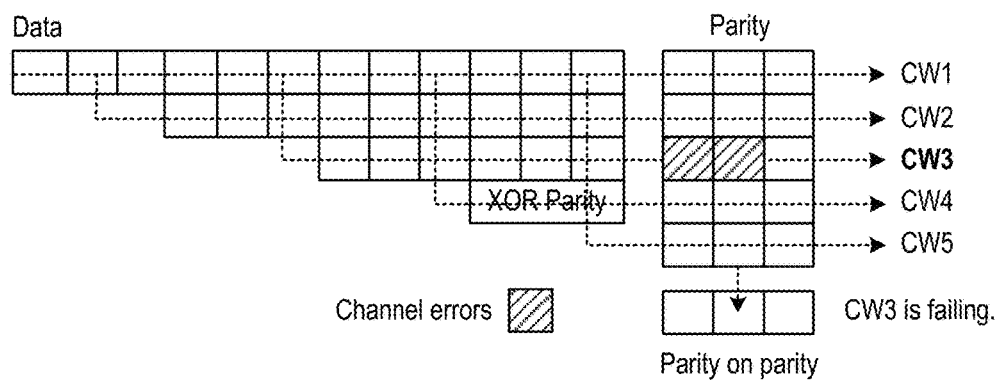
Figure 2E:
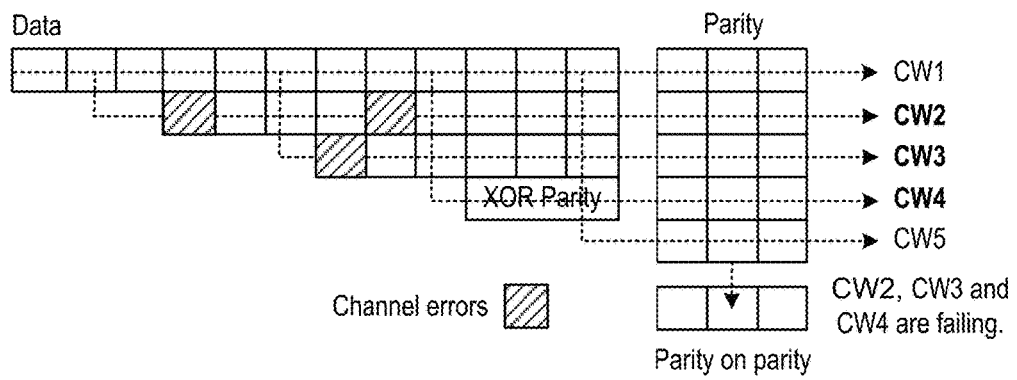
Figure 2F:
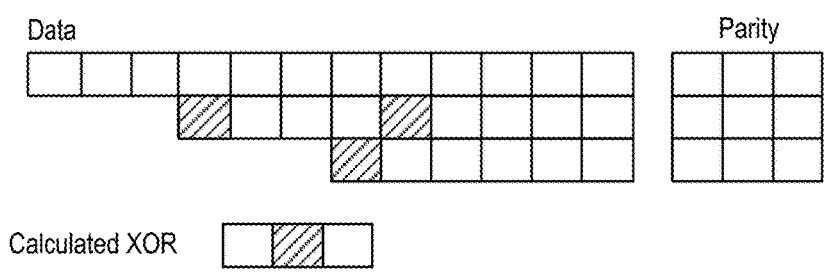
Figure 2G:
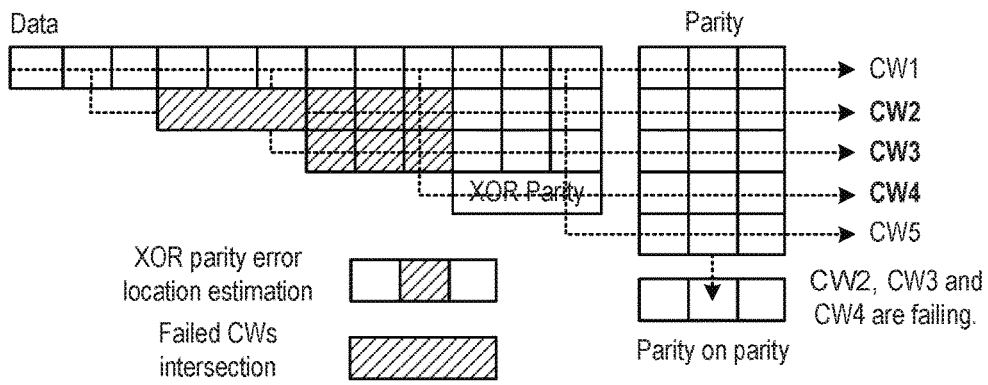

In FIG. 2C, the intersection of two failing codewords is corrected using XOR parity. In this example, the correction capability for constituent codes is assumed to be equal to 1. The stuck pattern shown in FIG. 2D can also be corrected through XOR parity by making correction in parity blocks. The decoding fails when there are three or more codewords failing (see FIG. 2E). The stuck pattern shown in FIG. 2E can be corrected in the following manner. First, the XOR parity is constructed through decoded data as shown in FIG. 2F and compared with XOR parity stored in the data. In this example, calculated XOR parity and stored XOR parity differ at one location which indicates that this is the possible error location (See FIG. 2G). The intersection of all pairs of failed codewords can contain the error at the estimated location. At failed error intersections, the flipping of the estimated bits can be tried and regular decoding can be performed. In this example, flipping in the intersection of CW2 and CW3 will not lead to successful decoding. However, flipping the bit in the intersection of CW2 and CW4 will decode all codewords successfully. In general, the value of I will be much larger than 3, and decoding through XOR parity can provide possible error locations better with large values of I and significantly reduce the number of flips for successful decoding. Let m error locations be provided through XOR parity and there are FI possible error location intersections. Then, 2 m bit flips can be tried on those FI intersections to get the successfully decoded data. In general, the XOR parity can also be used to correct errors for the case where there are more than 3 row codewords failing.

Figure 2H:
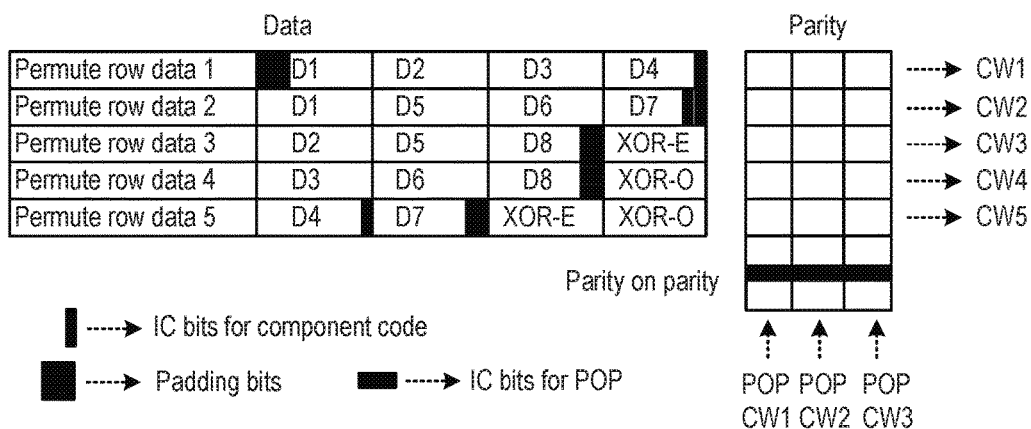
FIG. 2H is a simplified block diagram illustrating another generalized product code (GPC) in accordance with certain embodiments of the present disclosure.

FIG. 2H is a simplified block diagram illustrating another generalized product code (GPC) in accordance with certain embodiments of the present disclosure. Similar to the example of FIG. 2A, data is arranged in an array such that each data chunk or block is protected twice by constituent codes. Each codeword includes multiple data blocks and parity bits. Data blocks can include information blocks (or block of information bits) and XOR blocks or XOR parity blocks, which are blocks formed by an XOR operation of information bits. There is parity on parity (POP) code constructed for constituent code parities. Unlike the GPC in FIG. 2A, which has only one XOR block, the GPC in FIG. 2H has XOR-E and XOR-O, which are parities calculated on all even and odd data chunks respectively and are also protected twice using constituent codes. In FIG. 2H, user data, or information bits, is organized as an array of blocks of length I bits each labeled as D1, D2, . . . , D8. Padded zero-bits are shown in black. XOR parity intersections are labeled as XOR-O and XOR-E. Parity bits and IC (input control) bits for component codewords and POP codewords are shown.

Figure 3A:
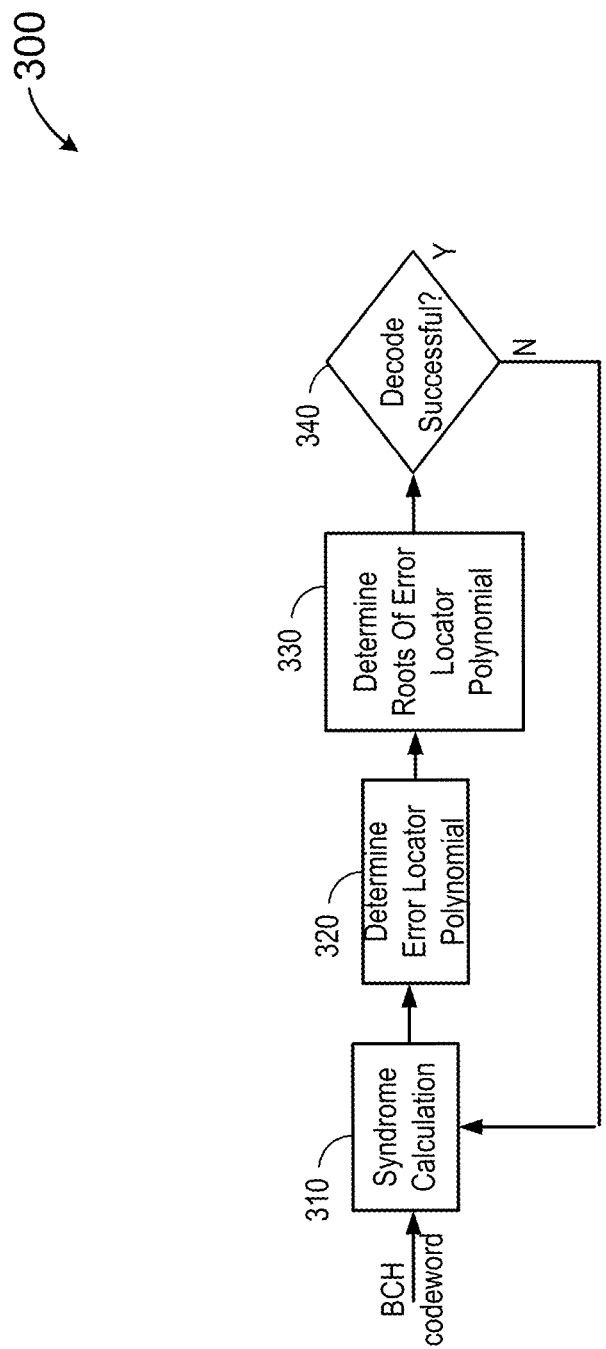
FIG. 3A is a simplified block diagram illustrating an example of a Bose-Chaudhuri-Hocquenghem (BCH) decoder in accordance with certain embodiments of the present disclosure.

In the GPC example described above, the constituent codes are represented by BCH codes. However, other coding schemes can also be used. FIG. 3A is a simplified block diagram illustrating an example of a Bose-Chaudhuri-Hocquenghem (BCH) decoder 300 in accordance with certain embodiments of the present disclosure. As illustrated in FIG. 3A, the decoder receives a BCH codeword and starts an iterative decoding process. For each iteration, the BCH decoder performs syndrome calculation (step 310) on the received codeword, determines error locator polynomial (step 320), and performs Chien search or similar procedures to determine roots of error locator polynomial (step 330). Roots of the error locator polynomial provide an indication of where the errors in the codeword are located. The error locations are used for error correction.

After correcting the errors, at 340, the decoder checks if the decoding process has resulted in a correct codeword. If so, the decoder outputs the decoded bits. Otherwise, the decoder may generate a bit flipping pattern, flipping one or more bits of the codeword based on the pattern and calculate syndrome values of the new codeword. The decoding process may continue until a correct codeword is found and/or a predetermined maximum number of iterations is reached.

Given the natural numbers m and t, a t-error correcting binary BCH code of length $n=2^m-1$ may be defined as:

$$c(x) \in GF(2)[x]: \deg c(x) \le n-1, c(\alpha) = c(\alpha^2) = c(\alpha^3) = \ldots = c(\alpha^{2t}) = 0$$

where $\alpha \in GF(2^m)$ is a primitive element. In other words, it is the set of all binary polynomials of degree at most n−1 such that when these are treated as polynomials over $GF(2^m)$, they must have $\alpha, \alpha^2, \alpha^3, \ldots, \alpha^{2t}$ as their roots.

If c(x) is the transmitted codeword, e(x) is the error polynomial, and R(x)=c(x)+e(x) is the received codeword, then given that $\alpha, \alpha^2, \alpha^3, \ldots, \alpha^{2t}$ are roots of c(x), an initial component syndrome may be calculated as:

$$S_i = r(\alpha^{i+1}) = e(\alpha^{i+1})$$

for i=0, 1, . . . , 2t−1.

The error locator polynomial generator uses the syndromes $S_0, S_1, S_{2t-1}$ to generate the error location polynomial $\Lambda(x)$, which is defined as:

$$\Lambda(x) = \Pi_{i=1}^{v}(1 - \alpha^{j_i} x).$$

Several methods exist in the art for finding the locator polynomial—for example, Berlekamp-Massey algorithm, Peterson's algorithm, and the like. The roots of the error location polynomial (i.e., $j_0, j_1, j_v$ in the equation above) indicate the locations of the errors, so finding the roots of the error location polynomial corresponds to finding the locations of the errors in a corresponding codeword.

Roots of the error location polynomial can be found using Chien search. For binary symbols, once the error locations have been identified, correction simply involves flipping the bit at each identified error location. For non-binary symbols, the error magnitude needs to be calculated, for example, using Forney Algorithm, to find out the magnitude of the correction to be made.

In general, a decoder for product codes may perform BCH decoding on one or more of the row constituent codes and/or column constituent codes iteratively to generate a correct codeword. For GPC, a decoder may perform BCH decoding on one or more of the row constituent codes iteratively to generate a correct codeword.

Figure 3B:
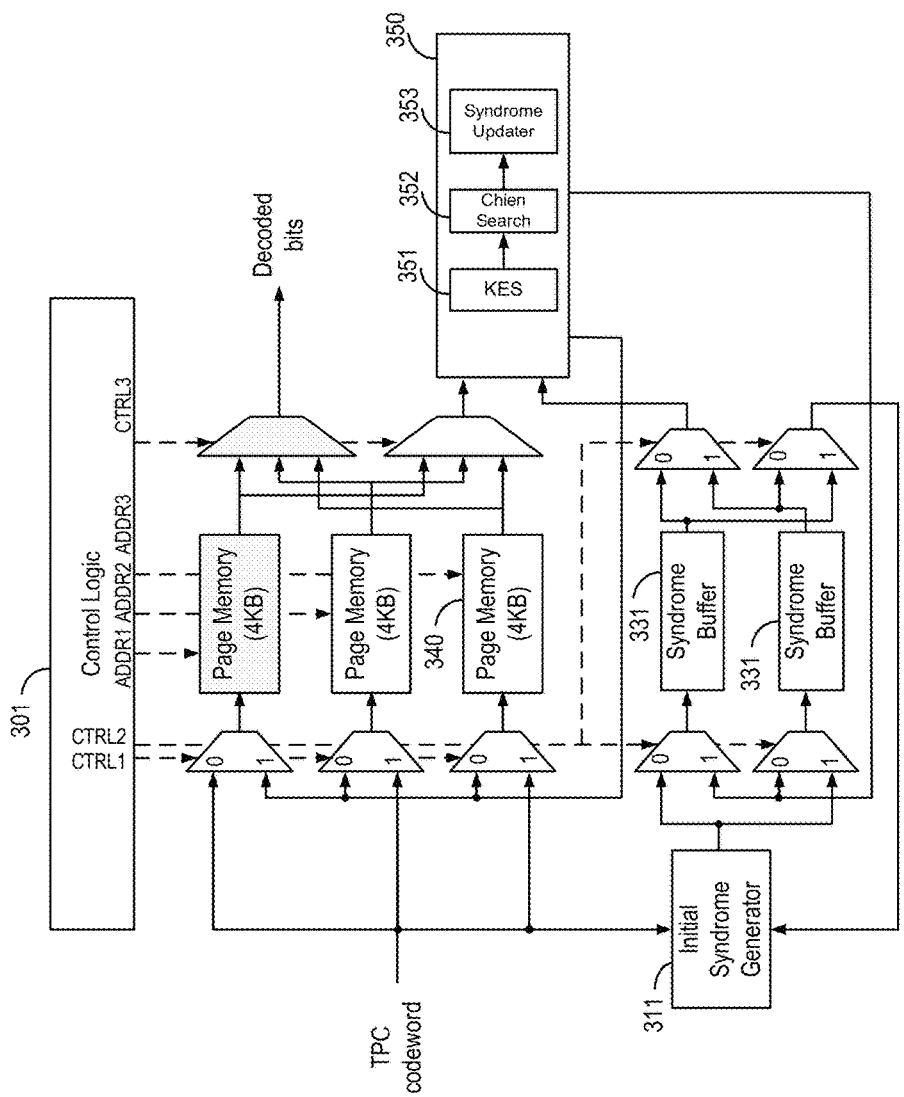
FIG. 3B is a block diagram illustrating a decoder in accordance with certain embodiments of the present disclosure.

FIG. 3B a block diagram illustrating a decoder according to an embodiment. As illustrated, the decoder has a control logic 310, an initial syndrome generator 320, one or more syndrome buffers 331, one or more page memories 340, and decoder 350. The initial syndrome generator is used to generate initial values for the syndromes. For example, after receiving a new codeword, the initial syndrome generator generates one or more syndromes for the decoder and stores them in the syndrome buffers 330. During the decoding procedure, the decoder utilizes the stored syndrome values to decode the codewords and correct errors.

In one embodiment, after finding an error pattern, the decoder corrects the data stored in the memories 340 and also updates the corresponding syndrome values stored in the syndrome buffers 330.

Decoder 350 includes Key equation solver (KES) 351, Chien search 352, and syndrome updater 353. In one embodiment, the syndrome values are calculated by initial syndrome generator 320 to initialize syndrome buffer 330. The decoder reads syndrome values from buffers during decoding iterations. After processing key equation solver (KES) 351 and Chien search 352, the decoder accesses page memory 340 and corrects the data based on the determined error patterns. Some or all of syndrome values are then updated in the syndrome buffer 330.

In one embodiment, the key equation solver is used to carry out the error location polynomial $\sigma(x)$, which may be defined as follows:

$$\sigma(x) = (1+x\beta_1)(1+x\beta_2) \ldots (1+x\beta_v) = 1 + \sigma_1 x^1 + \sigma_2 x^2 + \sigma_3 x^3 + \ldots + \sigma_v x^v.$$

The key equation describing the relation between $S(x)$ and $\sigma(x)$ may be derived as follows:

$$\Omega(x) = S(x) \times \sigma(x) \bmod x^{2t}$$

where $\Omega(x)$ is the error evaluator polynomial, $S(x)$ represents the syndrome polynomial, and t represents the error correction capability of the code. Two of the popular methods for solving the key equation are Berlekamp-Massey and modified Euclidean algorithms. After the key equation solver, Chien search is applied to find the roots of the error location polynomial $\sigma(x)$.

Figure 4:
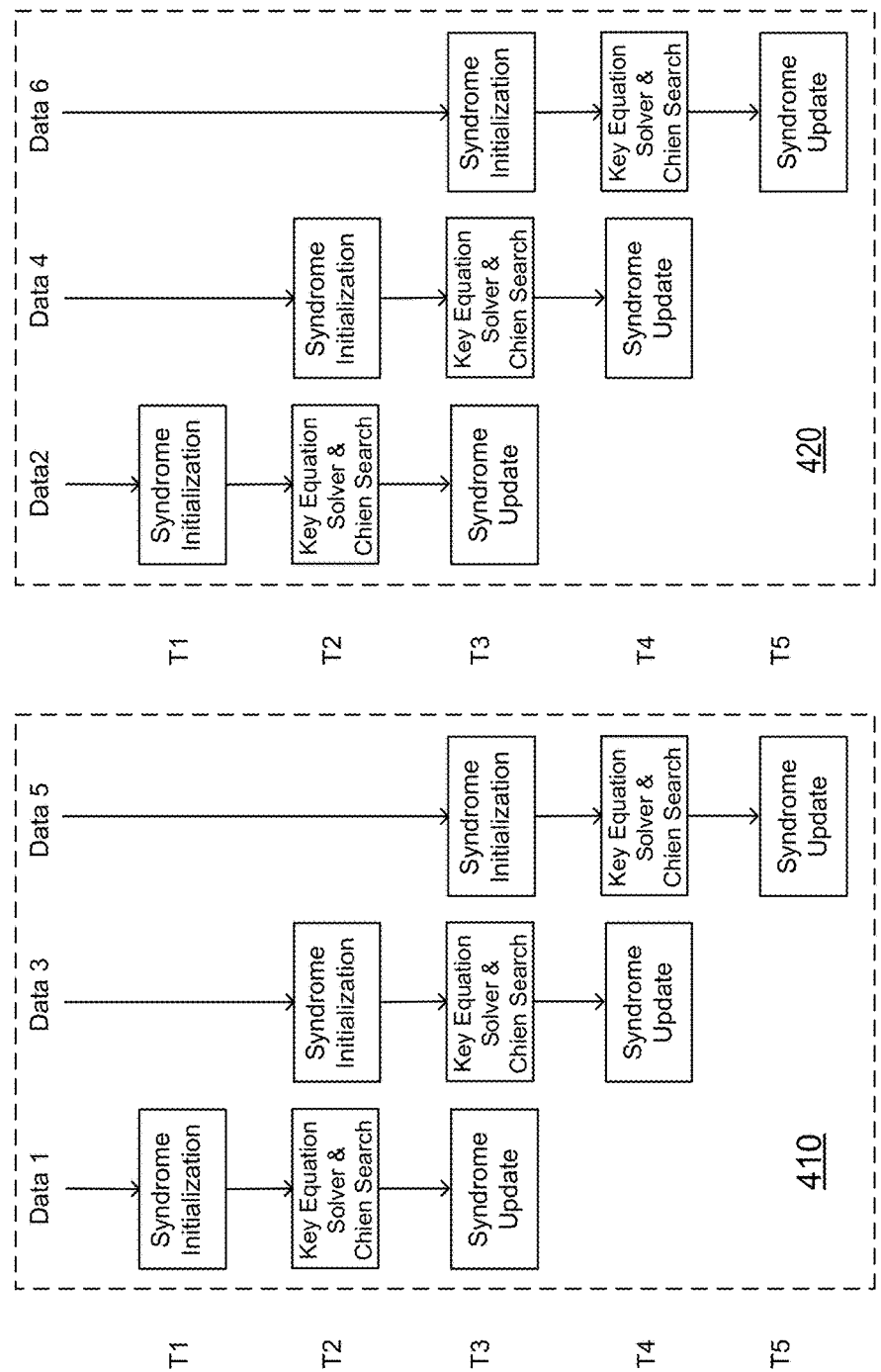
FIG. 4 is a simplified block diagram illustrating two pipelined decoders decoding six codewords in parallel in accordance with certain embodiments of the present disclosure.

FIG. 4 is a simplified block diagram illustrating two pipelined decoders decoding six codewords in parallel in accordance with certain embodiments of the present disclosure. It can be seen that two pipelined decoders 410 and 420 decode six codewords, Data 1 to Data 6, in parallel. During time T1, Data 1 is processed in Syndrome Initialization in decoder 410, and Data 2 is processed in Syndrome Initialization in decoder 420. During time T2, Data 1 is processed in Key Equation Solver and Chien Search, and Data 3 is processed in Syndrome Initialization in decoder 410. Simultaneously, during time T2, Data 2 is processed in Key Equation Solver and Chien Search, and Data 4 is processed in Syndrome Initialization in decoder 420. At a given time, six codewords could be processed in parallel. As explained above, in the GPC example, any two codewords share many data bits. In other embodiments of GPC, two codewords being processed in parallel can have a certain number of data bits or a block of data bits in common. The parallel decoding of two codewords at the same time can lead to clashes when both decoders update syndromes according to errors located in the intersection of the two decoded codewords. These clashes will occur more frequently when the number of parallel decoders is increased. This problem can also occur in parallel decoding in a single decoder with pipelined structure or operation.

In embodiments of the present disclosure, a coarse/fine decoding architecture is provided to avoid these clashes as described in detail below. It is noted that, as used herein, coarse decoding and fine decoding are also referred to as parallel decoding and sequential decoding, respectively.

Coarse Decoding Phase

In the coarse decoding phase constituent codewords are scheduled for decoding on both decoders (dec-1 and dec-2, shown in FIG. 4 as 410 and 420) in parallel. With three pipeline stages for every decoder, one constituent codeword decoding can potentially correct errors in the intersections with the next five scheduled codewords. Any corrections made in the intersections with the next five scheduled codewords will make the decoding of the corresponding codewords void. For example, dec-1 decodes constituent codeword cw-1. It updates syndromes to correct errors in the intersection, i.e., shared common block of bits, of cw-1 and constituent codeword cw-2, as well as the intersection of the cw-1 and constituent codeword cw-3. Then, any updates by decoders decoding cw-2 and cw-3 will be ignored or prohibited.

Fine Decoding Phase

The coarse decoding phase may cause a deadlock such that the decoding of some codewords gets ignored for many iterations of decoding. To avoid this situation, the decoding architecture also provides a fine decoding phase after some number of iterations with the coarse decoding phase. In this phase, a single decoder without a pipeline structure is used for decoding constituent codewords after coarse decoding. This single decoder will be run slower, but, in most cases, very few constituent codewords are left un-decoded after an iteration of fine decoding is completed.

Certain embodiments of the disclosure provide an error correction apparatus configured for decoding a plurality of constituent codewords in parallel. In some embodiments, the error correction apparatus includes a memory and a processor coupled to the memory. The processor is configured to obtain a first message having a plurality of constituent codewords from the memory. The plurality of constituent codewords are derived from a message encoded in a product code in which each constituent codeword has multiple blocks of data bits, and every pair of constituent codewords share a common block of data bits with each other, wherein each constituent codeword corresponds to a class of error correcting codes capable of correcting a pre-determined number of errors.

Figure 5:
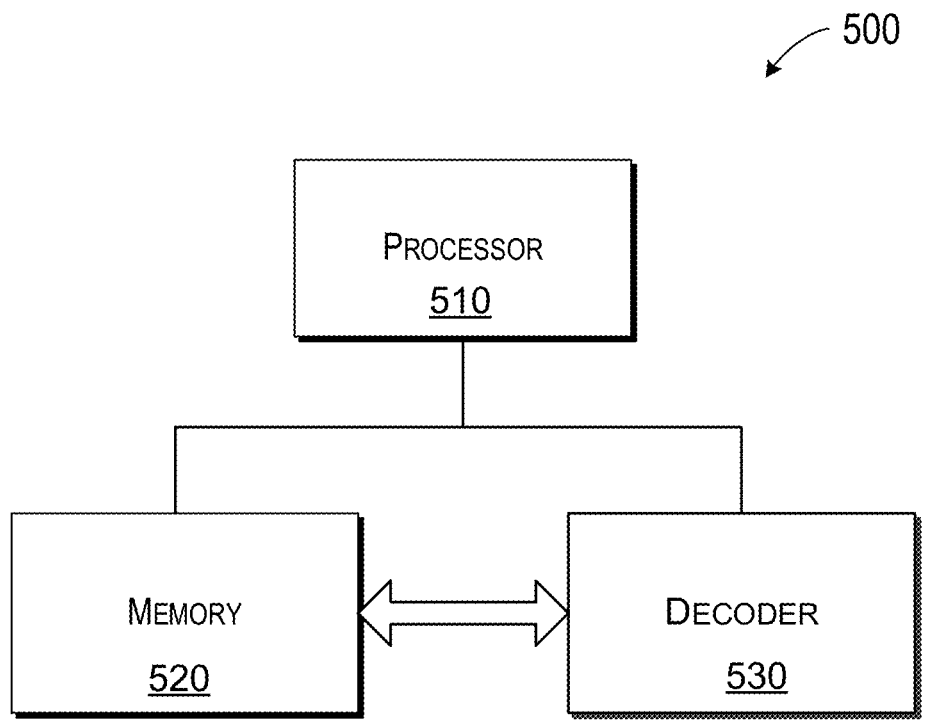
FIG. 5 is a simplified block diagram illustrating a memory device, such as a flash storage in accordance with certain embodiments of the present disclosure.

FIG. 5 is a simplified block diagram illustrating a memory device, such as a flash storage, according to an embodiment of the present disclosure. As shown in FIG. 5, memory device 500 includes a processor 510, a memory array 520 coupled to the processor, and a decoding apparatus 530. The decoding apparatus is configured to perform coarse decoding and fine decoding. In coarse decoding, the decoder decodes in parallel two or more codewords, which share a common block of bits, to determine error information. Next, the decoder corrects errors in a first codeword based on the error information. Here, the errors can be corrected at this point, or the errors can be marked for correction. Then, it is determined if the shared common block of data bits is corrected. If the shared common data block is updated, then error correction based on the error information is prohibited in codewords sharing the common block of data bits with the first codeword. In fine decoding, a single codeword is decoded at a time for error correction.

FIG. 5 can also represent a data decoding apparatus configured for decoding a plurality of codewords in parallel. As shown in FIG. 5, decoding apparatus 500 includes processor 510, a memory 520 coupled to the processor, and one or more decoders 530. Processor 510 is configured to read encoded data including a plurality of codewords. The plurality of codewords are encoded in a product code in which each codeword has multiple blocks of data bits and every two codewords share a common block with each other. Examples of the product code are described above in connection with FIGS. 2A-2G. The one or more decoders 530 are configured to perform parallel decoding of two or more codewords. Decoder 530 can include one or more decoders capable of pipeline operations for parallel decoding, such as decoders 410 and 420 in FIG. 4. The decoders can also perform sequential decoding by deactivating the pipeline operation. Decoding apparatus 500 is configured to perform coarse decoding and fine decoding, which is described below with reference to FIG. 6.

Figure 6:
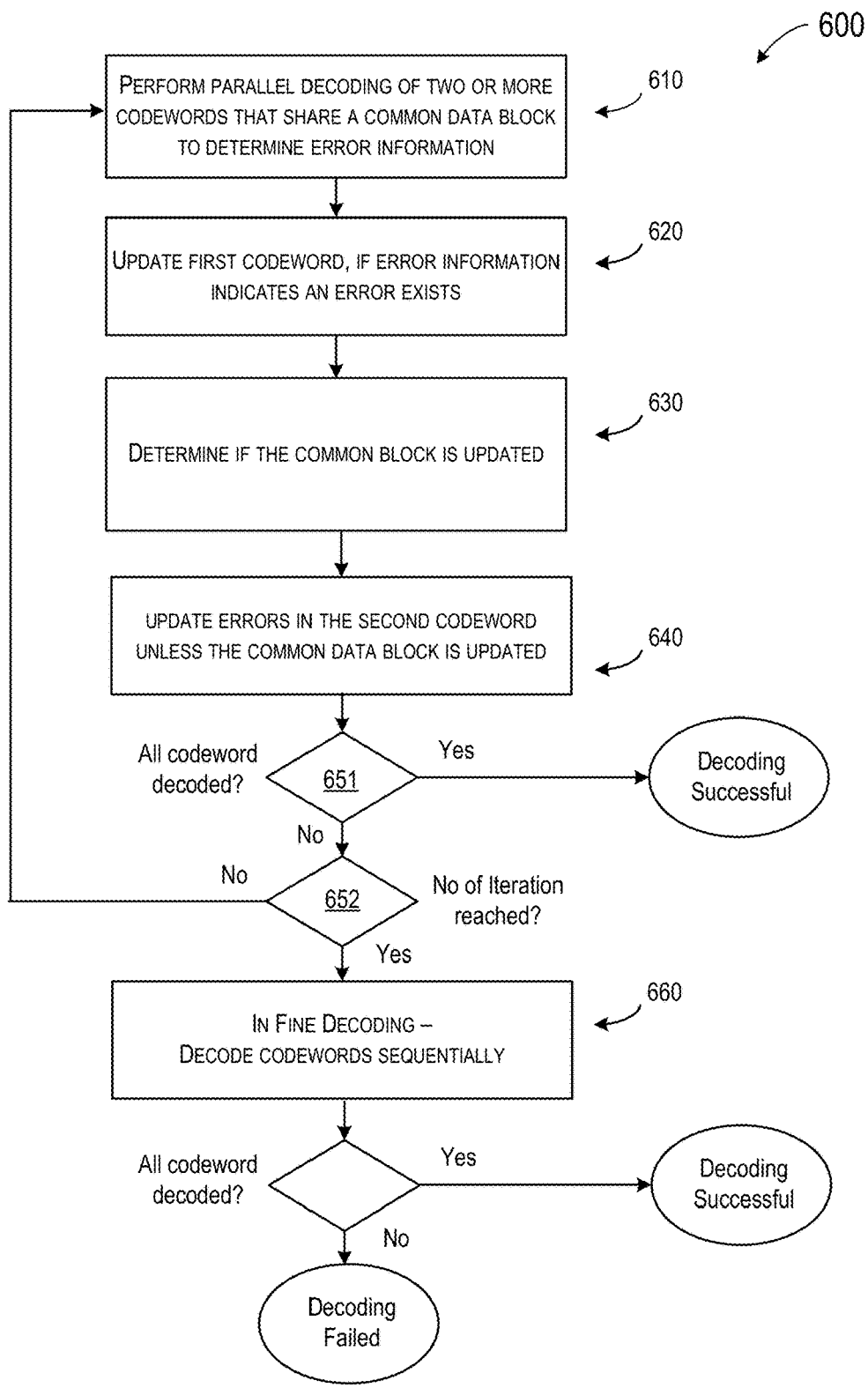
FIG. 6 is a simplified flow chart illustrating the operation of decoding apparatus 500 in accordance with certain embodiments of the present disclosure.

FIG. 6 is a simplified flow chart 600 illustrating the operation of decoding apparatus 500 according to an embodiment of the present disclosure. The operation includes the following processes. In process 610, the apparatus performs parallel decoding of two or more codewords that share a common data block to determine error information. In process 620, the apparatus updates the first codeword if the error information indicates that an error exists. In process 630, it is determined if the common data block between the first and second codewords is updated. In process 640, the decoding apparatus updates the second codeword based on the error information, unless the common block is updated in the decoding of the first codeword. The coarse decoding is repeated until the plurality of codewords are successfully decoded or until a predetermined number of iterations has been reached, as shown in processes 651 and 652. Next, in process 660, if a coarse decoding is not successfully completed or a predetermined number of iterations has been reached, then the fine decoding is performed. As shown in process 660, in the fine decoding, the codewords are decoded sequentially one at a time.

In coarse decoding, the parallel decoding can be performed by a single decoder with a pipeline structure. Alternatively, the coarse decoding can be performed by two or more decoders. In an embodiment, the fine decoding is performed by a single decoder with no pipeline operation. In some embodiments, each decoder is configured to solve an error location polynomial using a key equation solver. Each decoder can be configured to generate error information using Chien search. In some embodiments, each of the decoders can be configured for pipelined parallel decoding in three stages including syndrome initialization, key equation solver and Chien search, and syndrome update.

An example of the product code is the generalized product code (GPC) described above. In an embodiment, the encoded data or encoded message includes a group of data bits arranged in data blocks. The data blocks include blocks of information bits and one or more blocks of XOR bits. The XOR bits are formed by exclusive OR operation on the information bits. Each codeword includes a number of data blocks and parity bits, and the parity bits are formed by encoding the data blocks using an error-correcting coding scheme, e.g., BCH codes. The encoded data further includes parity-on-parity (POP) bits, which are formed by encoding the parity bits of the codewords using a second error-correcting coding scheme. The second error-correcting coding scheme can be the same as the first error-correcting coding scheme, or a different coding scheme. In this product code, each data block is included in two or more codewords, and every pair of codewords shares a common data block. For this product code, the coarse decoding and fine decoding are described below in more detail with reference to FIGS. 7 and 8.

Figure 7:
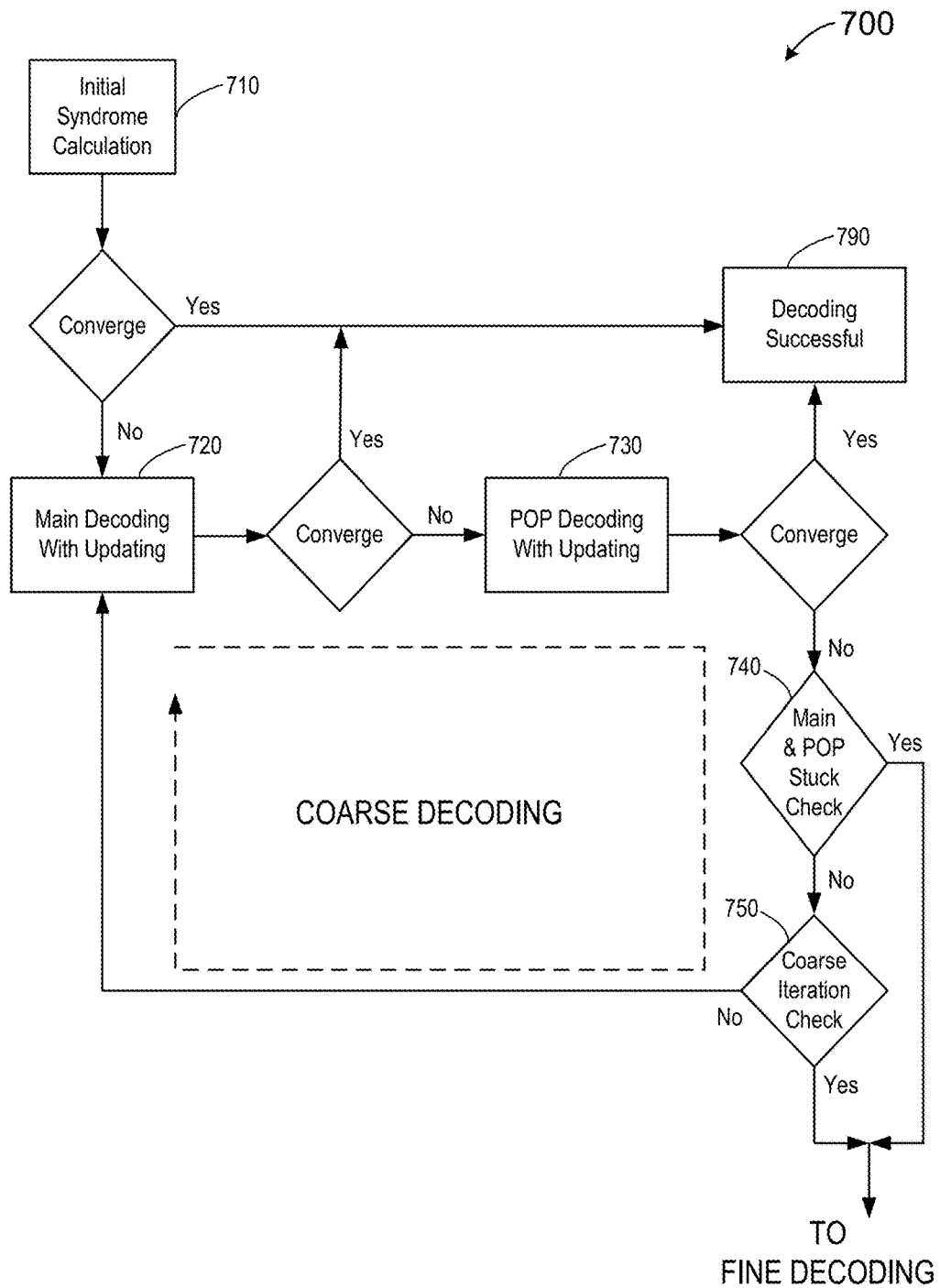
FIG. 7 is a simplified flow chart illustrating a coarse decoding operation in accordance with certain embodiments of the present disclosure.

FIG. 7 is a simplified flow chart illustrating a coarse decoding operation 700 according to an embodiment of the present disclosure. For this product code, the apparatus is configured to decode the plurality of codewords in parallel. In process 710, the initial syndrome calculation is performed. If this operation converges and no errors are found, then the decoding is successful. Otherwise, main decoding, which refers to decoding of the codewords, is performed as shown in process 720. Here, in each parallel decoding operation, two or more codewords are decoded in parallel, and a codeword is updated to correct errors unless a shared common data block is already updated or designated for update in this parallel decoding operation. If the plurality of codewords are not decoded successfully, then, at process 730, the parity bits and the POP bits are decoded and updated. In some embodiments, POP decoding is performed sequentially. This coarse decoding operation repeats the above decoding operations until all codewords are decoded successfully, 790, or until a preset number of iterations is reached. In FIG. 7, process 740, Main & POP Stuck Check, determines if the decoding is successful, and process 750, Coarse Iteration Check, determines if a preset number of iterations is reached. If the coarse decoding is not successful, then fine decoding is performed, which is described below with reference to FIG. 8.

Figure 8:
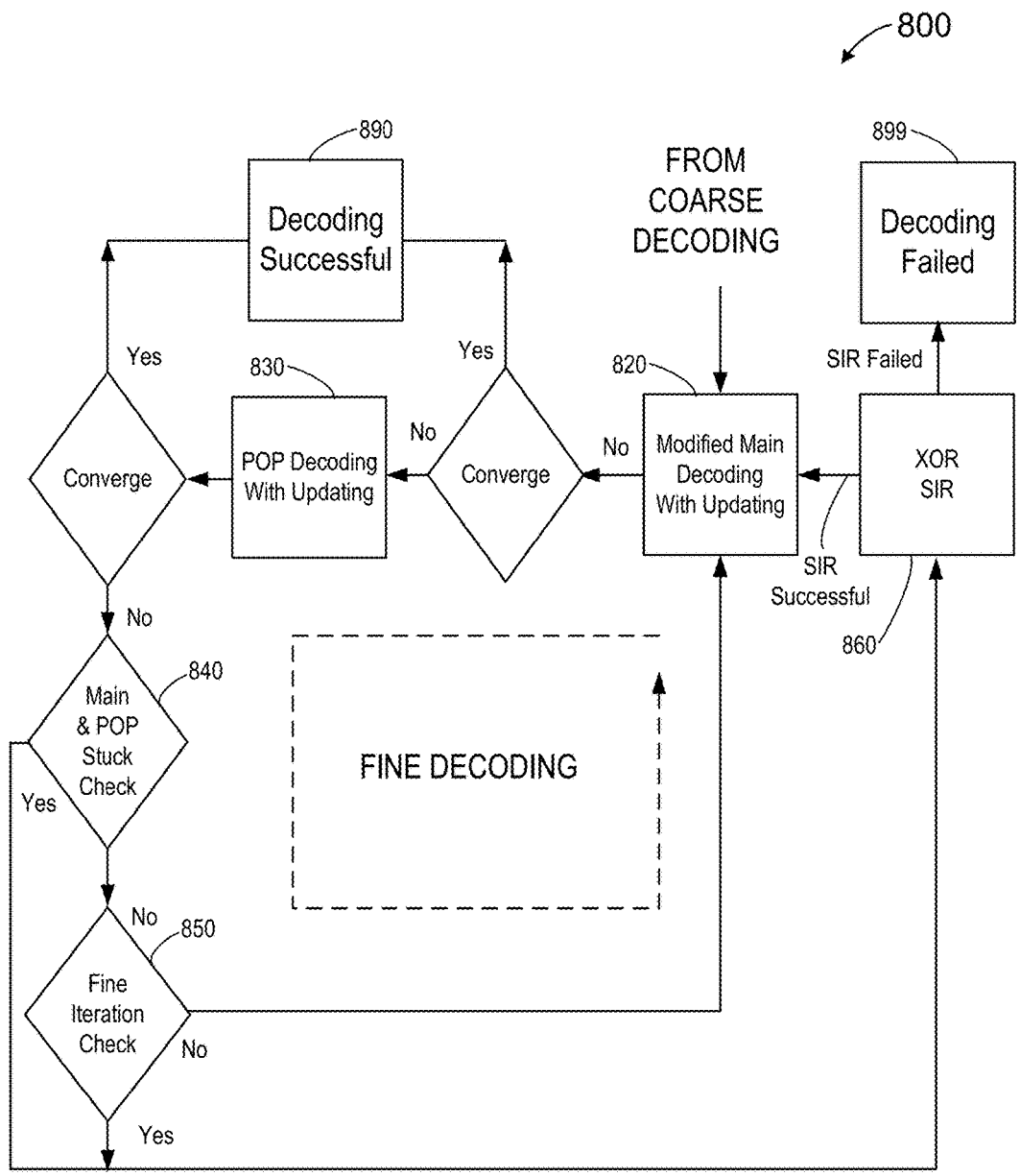
FIG. 8 is a simplified flow chart illustrating a fine decoding operation 800 in accordance with certain embodiments of the present disclosure.

FIG. 8 is a simplified flow chart illustrating a fine decoding operation 800 according to an embodiment of the present disclosure. In the fine decoding, the apparatus is configured to decode the plurality of codewords sequentially, one at a time, and the codeword is updated to correct errors. If the plurality of codewords are not decoded successfully, then the parity bits and the POP bits are decoded and updated. The decoding processes involved in fine decoding are similar to those in coarse decoding of FIG. 7, but are performed sequentially in fine decoding.

In process 820, Modified Main Decoding With Updating, the codewords are decoded sequentially, using a single decoder without a pipeline, and a codeword is updated to correct errors. If the plurality of codewords are not decoded successfully, then, in process 830, the parity bits and the POP bits are decoded and updated. This decoding operation repeats the above decoding operations until all codewords are decoded successfully, 890, or until a preset number of iterations is reached. In FIG. 8, process 840, Main & POP Stuck Check, determines if the decoding is successful, and process 850, Coarse Iteration Check, determines a preset number of iterations is reached. When fine decoding fails, in process 860, an XOR SIR operation can be performed, in which information provided by the XOR bits is used for stuck intersection recovery (SIR). An example of error location estimation through XOR parity and possible error intersection is described above in connection with FIGS. 2A-2G. If the SIR operation is successful, then the fine decoding is repeated. If this process fails, then the decoding operation is determined to have failed, at process 899.

To evaluate the performance, we have simulated this proposed coarse/fine decoding architecture for different code rates and at different codeword failure rates (CFR). The results are shown in Tables 1-5 below. For comparison, we have assumed that there exists a hypothetical ideal decoder architecture, which is referred to as a Genie architecture, that runs a single BCH decoder with a single pipeline that can run at 6 times higher clock cycle. The Genie architecture provides the best throughput; however, it should be noted that this Genie architecture is not practical and is only used for comparison purposes.

In Table 1 and Table 2, throughput and latency are compared for the proposed architecture at the highest code rate (1280B/16 KB) at CFR 1e-10 and 1e-6, respectively. Table 3 and Table 4 show throughput and latency for the proposed architecture at the lowest code rate (2048B/16 KB) at (CFR) 1e-10 and 1e-6, respectively.

TABLE 1

Throughput/latency for the proposed scheme at the highest code rate (1280 B/16 KB) at CFR 1e-10.

|  | Genie Architecture | Proposed Architecture |
| --- | --- | --- |
| Average Num. of Pipeline Stages | 59.00 | 59.02 |
| Throughput @ 300 MHz | 1019 MB/s | 1019 MB/s |
| Avg. Latency @ 300 MHz | 8.66 us | 8.66 us |

TABLE 2

Throughput/latency for the proposed scheme at the highest code rate (1280 B/16 KB) at CFR 1e-6.

|  | Genie Architecture | Proposed Architecture |
| --- | --- | --- |
| Average Num. of Pipeline Stages | 59.24 | 60.6 |
| Throughput @ 300 MHz | 1019 MB/s | 1019 MB/s |
| Avg. Latency @ 300 MHz | 8.66 us | 8.66 us |

TABLE 3

Throughput/latency for the proposed scheme at the lowest code rate (2048 B/16 KB) at CFR 1e-10.

|  | Genie Architecture | Proposed Architecture |
| --- | --- | --- |
| Average Num. of Pipeline Stages | 67.55 | 78.51 |
| Throughput @ 300 MHz | 1016 MB/s | 875 MB/s |
| Avg. Latency @ 300 MHz | 9.06 us | 10.52 us |

TABLE 4

Throughput/latency for the proposed scheme at the lowest code rate (2048 B/16 KB) at CFR 1e-6.

|  | Genie Architecture | Proposed Architecture |
| --- | --- | --- |
| Average Num. of Pipeline Stages | 81.18 | 95.31 |
| Throughput | 843 MB/s | 720 MB/s |
| Avg. Latency | 10.93 us | 12.79 us |

TABLE 5

Throughput loss due to the proposed architecture at lowest and highest code rates compared to Genie architecture.

| Code Rate | CFR | Throughput Loss |
| --- | --- | --- |
| 1280 B/16 KB | 1e-10 | 0% |
|  | 1e-6 | 0% |
| 2048 B/16 KB | 1e-10 | ~16% |
|  | 1e-6 | ~17% |

It can be seen that there is no throughput loss by the GPC architecture at the highest code rate, and, at the lowest rate, it has been observed that there has been small throughput loss from the proposed scheme.

The embodiments described above can support decoding several constituent decoders in parallel for increasing throughput. The data dependency issue described above is mitigated with two-phase operations—a coarse decoding phase followed by a fine decoding. As noted above, coarse decoding and fine decoding are also referred to as parallel decoding and sequential decoding, respectively. In the coarse decoding phase, several constituent decoders are decoded in parallel for throughput enhancement. However, one constituent codeword decoding can potentially correct errors in the intersections with the next few scheduled codewords. A deadlock condition might occur within coarse decoding; therefore, a fine decoding phase is used after coarse decoding, which applies a single constituent decoder without pipeline structure.

The coarse decoding, also referred to as parallel decoding, described above can be implemented according to the method described below. In an embodiment, the method includes reading, from a memory, encoded data including a plurality of codewords. Each codeword has multiple data blocks, and each data block includes a number of data bits. The method includes decoding, in parallel, first and second codewords that share a common data block to determine error information associated with each codeword. For each error detected in the decoding process, the error information identifies one or more data blocks having errors and associated error bit patterns. And the method includes updating the codewords based on the error information associated with the common data block.

The error information can be maintained in a data storage area in the system. In a specific embodiment, the storage area can include a data dependency list, which allows status of common data blocks in the intersection of multiple codewords being decoded in parallel. The method can be explained using a decoding apparatus with a two-bit error correcting capability used to decode three codewords in parallel, CW1, CW2, and CW3. Using the example illustrated in FIG. 2B, each of these codewords includes four data blocks as listed below.

| CW1 | D1 | D2 | D3 | D4 |
| --- | --- | --- | --- | --- |
| CW2 | D1 | D5 | D6 | D7 |
| CW3 | D2 | D5 | D8 | D9 |

Assuming the parallel decoding is carried out in a pipelined decoder, the data dependency list can be implemented using a FIFO (first-in first-out) buffer that identifies the data blocks (error index) that have been identified as having errors during the decoding process. The decoding skips the update of a common data block, if the common data block is already updated in the decoding of an earlier step in the parallel decoding operation.

In the beginning of the decoding process, the data dependency list is empty, as indicated by the word "null."

Data dependency list: {null, null, null, null}

Assuming the decoding of CW1 (D1, D2, D3, D4) finds errors in D2 and D3, the data dependency list is updated to appear as follows.

Data dependency list: {D2, D3, null, null}

The error correction stage of the decoder can be used to correct errors in D2 and D3.

Next, the decoding of CW2 (D1, D5, D6, D7) finds errors in D5 and D6, which are not listed in the data dependency list. Therefore, the error correction stage of the decoder can be used to correct errors in D5 and D6. And the data dependency list is updated to appear as follows.

Data dependency list: {D5, D6, D2, D3}

Next the decoding of CW3 (D2, D5, D8, D9) finds errors in D2 and D9. Since D2 is in the current data dependency, D2 will be or has been updated in the error correction stage of CW1. Therefore, the decoding skips the updating of D2 during the decoding of CW3. The error correction stage of the decoder can be used to correct error in D9. The data dependency list is updated to appear as follows.

Data dependency list: {null, D9, D5, D6}

In this case, D2 does not appear in the data dependency list, because it is understood that the two codewords that share D2, namely D1 and D3, have already been processes, and D2 will not appear in another codeword.

At this point, CW1 has already exited the 3-stage pipelined decoder, and a fourth codeword CW4 enters the pipeline, with the data dependency list showing the error indexes as {null, D9, D5, D6}.

It can be seen that the data dependency list identifies the data blocks having errors (error indexes) in the two codewords that have been decoded ahead of the third codeword in the 3-stage pipelined parallel decoder. Since the decoder is assumed to have a two-bit error correcting capability, two indexes are listed for each codeword. The method described above can also be applied to parallel decoding carried out by three separate decoders instead of a 3-stage pipeline parallel decode.

In some embodiments, the data dependency list includes error bit patterns for each of the identified error data blocks. For example, assuming each of the data blocks, D1, D2, . . . , has three data bits, then the possible error bit patterns include [001], [010], [100], . . . , etc. Each "1" bit in the error bit pattern indicates that the corresponding bit in the data block is an error bit and needs to be corrected or flipped. For example, error bit pattern [010] indicates that the error is at the second bit, which is to be flipped in the error correction step or error update step. For example, a data dependency list of {D5, [010]; D6, [001]; D2 [100], D3, [010]} indicates that, in the first codeword CW1, data blocks D2 and D3 have errors, and the error in data block D2 is at the first bit ([100]) and the error in data block D3 is at the second bit ([010]). Further, in the second codeword CW2, data blocks D5 and D6 have errors, and the error in data block D5 is at the second bit ([010]) and the error in data block D6 is at the third bit ([001]). A more general data dependency list would include the following error information.

CW1 error Index #1, CW1 error pattern #1;
CW1 error index #2, CW1 error pattern #2;
CW2 error Index #1, CW2 error pattern #1;
CW2 error index #2, CW2 error pattern #2.

The error information described above can be used in parallel decoding of codewords that may share a common data block. The method can include reading, from a memory, encoded data including a plurality of codewords. Each codeword has multiple data blocks, and each data block includes a number of data bits. The method also includes decoding, in parallel, first and second codewords that share a common data block to determine error information associated with each codeword. For each error, the error information identifies one or more data blocks have errors and associated error bit patterns. The method also includes updating the codewords based on the error information associated with the common data block.

Figure 9:
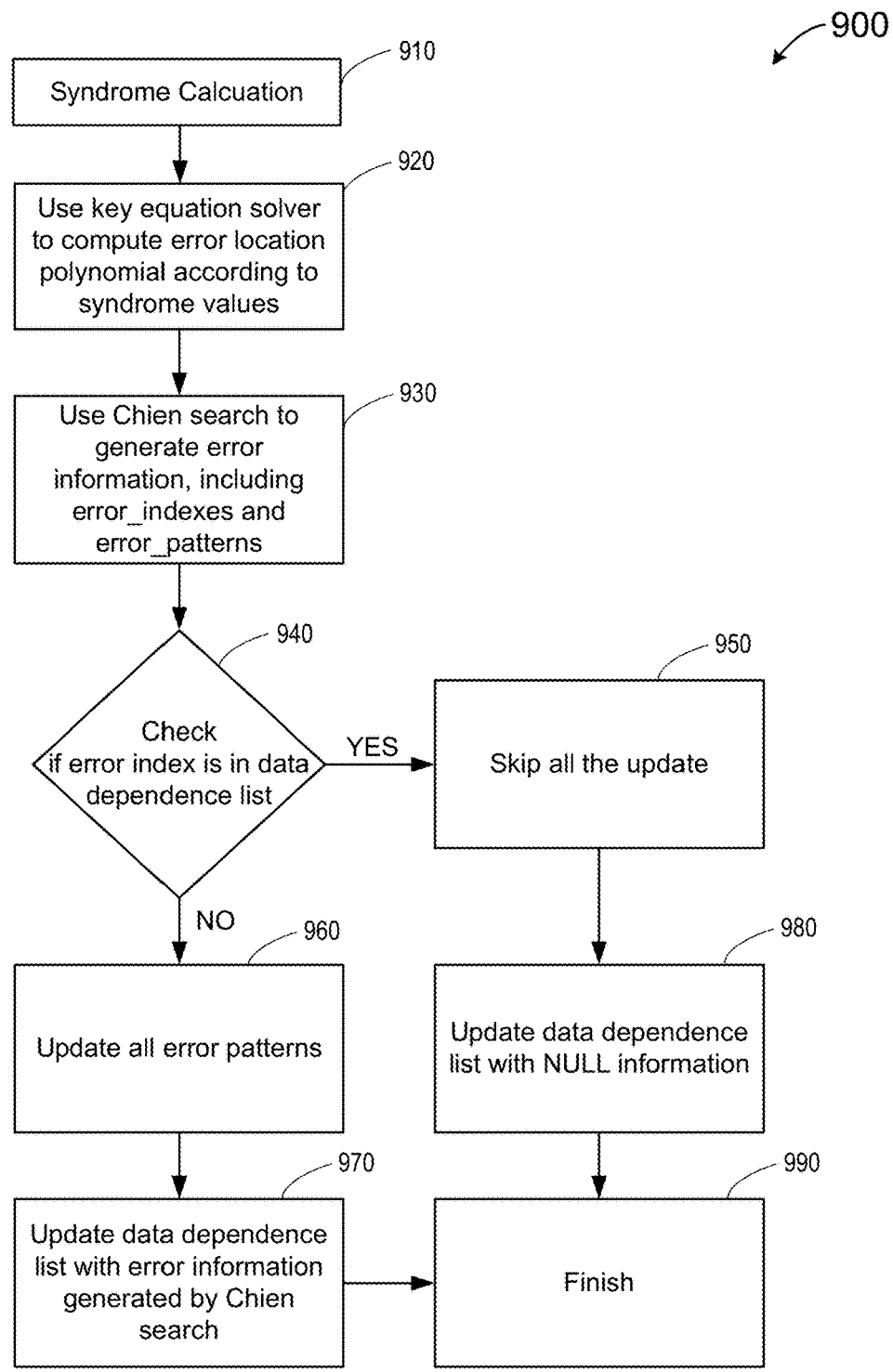
FIG. 9 is a simplified flow chart illustrating a method 900 for parallel decoding in accordance with certain embodiments of the present disclosure.

FIG. 9 is a simplified flow chart illustrating a method 900 for parallel decoding in accordance with certain embodiments of the present disclosure. This method can be applied to any parallel decoding of constituent codewords that share at least one common data block, such as the parallel decoding of two constituent codewords from a GPC codeword or the parallel decoding of a row codeword and a column codeword from a TPC codeword. As described in connection with FIGS. 3A, 3B, 4, and 5, the decoding process in method 900 can include syndrome calculation (910), use key equation solver to compute error location polynomial according to syndrome values (920), and use Chien search to generate error information, including error_indexes and error_patterns (930). As described above, the error_indexes identify the data block having errors, and the error_patterns, also referred to as error bit patterns, identify the error bit locations in a data block. The error indexes and error_patterns are kept in the data dependency list.

Next, updating the codewords is based on the error information associated with the common data block. At step 940, the method includes determining if the error index for the codeword being decoded already exists in the data dependency list. If not, the error index for the codeword being decoded does not exist in the data dependency list, and there is no risk that a common data block will be updated twice in the decoding of two codewords. Therefore, the method proceeds to update the current codeword, i.e., to correct errors in all data blocks in the current codeword (960). At 970, the data dependency list is updated with error information generated by Chien search. At this point, the decoding of the current codeword is finished (990).

If, however, at step 940, the data block identified by the error_index is a common data block that has already been identified as having an error in another codeword being decoded in the parallel decoding process, the data block will be updated in the correction step of that codeword. As a result, the updating of all data blocks in the current codeword is skipped to prevent updating the common data block twice (950). Next, at 980, the data dependency list is updated with "null" in the entries for the current codeword, since no error is corrected in the current codeword. At this point, the decoding of the current codeword is finished (990).

In the method illustrated by the flow chart in FIG. 9, if a common block is already being updated by the decoding of another codeword according to the error_index in the data dependency list, then the current codeword is not updated, and will need to be updated in another iteration of decoding. In some other embodiments, both the error_index and the error_pattern are used in the parallel decoding process, as illustrated in FIG. 10.

Figure 10:
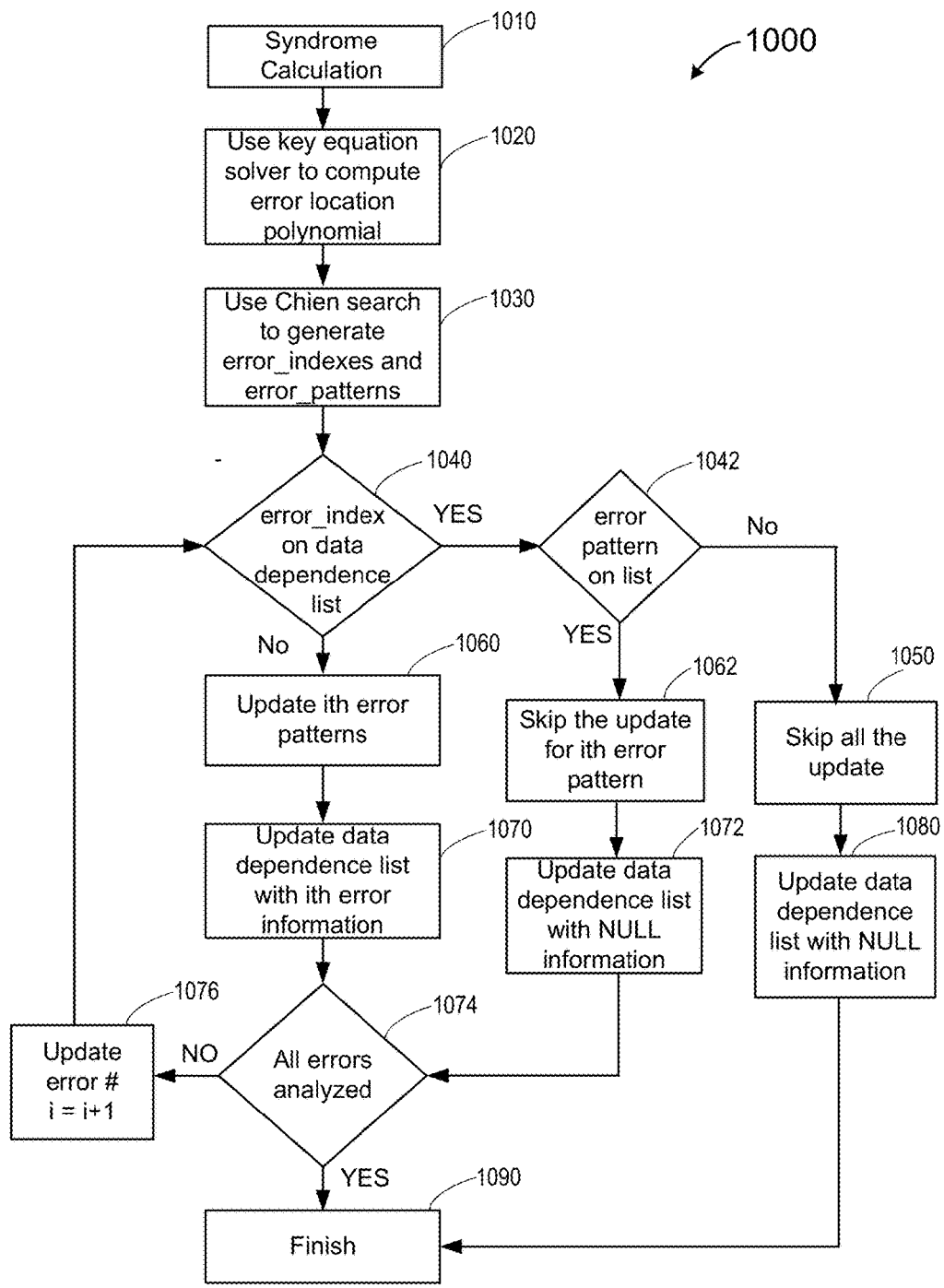
FIG. 10 is a simplified flow chart illustrating another method for parallel decoding in accordance with alternative embodiments of the present disclosure.

FIG. 10 is a simplified flow chart illustrating another method for parallel decoding in accordance with alternative embodiments of the present disclosure. Similar to method 900 in FIG. 9, in method 1000 in FIG. 10, the decoding process can include syndrome calculation (1010), use the key equation solver to compute an error location polynomial according to syndrome values (1020), and use Chien search to generate error information, including error_indexes and error_patterns (1030). As described above, the error_indexes identify the data block having errors, and the error_patterns, also referred to as error bit patterns, identify the error bit locations in a data block. The error_indexes and error_patterns are kept in the data dependency list.

Next, the decision to update the codeword is based on the error information associated with the common data block. At step 1040, the method includes determining if the error_index for the codeword being decoded already exists in the data dependency list. If not, the error_index for the codeword being decoded does not exist in the data dependency list, and there is no risk that a common data block will be updated twice in the decoding of two codewords. Therefore, the method proceeds to update the current codeword, i.e., to correct errors in all data blocks in the current codeword. At 1070, the data dependency list is updated with error information generated by Chien search. Steps 1074 an 1076 guide the decoding through the list of identified errors. After all the errors in the codeword are updated, the decoding of the current codeword is finished (1090).

If, however, at step 1040, the data block identified by the error_index is a common data block that has already been identified as having an error in another codeword being decoded in the parallel decoding process, the data block will be updated in the correction step of that codeword. A further test is carried out (1042) to determine if the identified error bit pattern (error_pattern) is the same as the error_pattern for the data block identified by the error-index in the data dependent list. If the error pattern is the same, it indicates that the error in this data block has been corrected in an earlier decoding. Therefore, the data block can be considered having been updated (or corrected), and there is no need to update it again. Therefore, the decoder skips the update of this error pattern (1062). Next, at 1072, the data dependency list is updated with "null" in the entries for the current codeword, since no error is corrected in the current codeword. At this point, steps 1074 an 1076 guide the decoding through the list of identified errors. After all the errors in the codeword are updated, the decoding of the current codeword is finished (1090).

If, at step 1042, it is determined that the identified error bit pattern (error_pattern) is not the same as the error_pattern for the data block identified by the error-index in the data dependent list, the data block identified by the error_index is a common data block that has already been identified as having a different error in another codeword being decoded in the parallel decoding process. As a result, the updating of all data blocks in the current codeword is skipped to prevent updating the common data block twice (1050). Next, at 1080, the data dependency list is updated with "null" in the entries for the current codeword, since no error is corrected in the current codeword. At this point, the decoding of the current codeword is finished (1090).

Compared with method 900 in FIG. 9, method 1000 in FIG. 10 uses both error index and error pattern information in the data dependency list. Method 1000 can help to reduce the number of skip procedures to be applied, and it can reduce the number of codewords that include data blocks which have errors but have not been updated. As a result, the latency loss can be shortened, and the decoding throughput can be increased.

Method 1000 described above can be implemented using the decoding apparatus described above in connection with FIGS. 3A, 3B, 4, and 5. For example, a decoding apparatus configured for decoding a plurality of codewords in parallel can include a memory, a processor coupled to the memory, and one or more decoders configured to perform parallel decoding of two codewords. The processor is configured to read encoded data including a plurality of codewords from the memory. The plurality of codewords is encoded in a product code in which each codeword has multiple data blocks, and each data block has a number of data bits.

In some embodiments, the apparatus is configured to perform parallel decoding of first and second codewords sharing a common data block to determine error information associated with each codeword. For every error, the error information identifies one or more data blocks having errors and associated error bit patterns. The apparatus is configured to update the first codeword if the error information associated with the first codeword indicates an error and, if the error information associated with the second codeword indicates an error, determine whether to update the second codeword as follows. First, the decoding apparatus determines if the common data block between the first and second codewords is updated in the updating of the first codeword. If the common data block is not updated, the decoding apparatus updates the second codeword based on the error information associated with the second codeword. If the common data block is updated and the error bit pattern in the common data block identified in the decoding of the second codeword is the same as the error bit pattern in the common data block identified in the decoding of the first codeword, the decoding apparatus updates data blocks other than the common data block in the second codeword without updating the common data block. Further, if the common data block is updated and the error bit pattern in the common data block identified in the decoding of the second codeword is different from the error bit pattern in the common data block identified in the decoding of the first codeword, the decoding apparatus skips the updating of the second codeword. In the latter case, the error in the second codeword is not updated, and it will be processed in the next decoding step.

In some embodiments, a memory device can include the decoding mechanisms described above. For example, the memory device can include a memory array, a processor coupled to the memory array, and a decoding apparatus. The decoding apparatus is configured to perform parallel decoding of codewords. Each of the codewords has a plurality of data blocks, and each data block having a number of data bits. The decoding apparatus is configured to decode in parallel two or more codewords, which share a common data block, to determine error information associated with each codeword. For each error, the error information identifies one or more data blocks having errors and associated error bit patterns. The decoding apparatus is configured to update the two or more codewords based on the identified one or more data blocks having errors and the associated error bit patterns.

In an embodiment of the above memory device, the decoding apparatus is configured to update a first codeword according to error information associated with the first codeword. The decoding apparatus is also configured to update a second codeword according to the error information associated with the second codeword, unless the common data block is updated in the updating of the first codeword and the error bit pattern in the common data block identified in the decoding of the second codeword is different from the error bit pattern in the common data block identified in the decoding of the first codeword.

In some embodiments of the memory device, the decoding apparatus is configured to decode a plurality of codewords that are encoded in a product code in which each codeword has multiple blocks of data bits, wherein codewords belonging to a same pair of codewords share a common data block.

The embodiments disclosed herein are not to be limited in scope by the specific embodiments described herein. Various modifications of the embodiments of the present disclosure, in addition to those described herein, will be apparent to those of ordinary skill in the art from the foregoing description and accompanying drawings. Further, although some of the embodiments of the present disclosure have been described in the context of a particular implementation in a particular environment for a particular purpose, those of ordinary skill in the art will recognize that its usefulness is not limited thereto and that the embodiments of the present disclosure can be beneficially implemented in any number of environments for any number of purposes.

Figure 11:
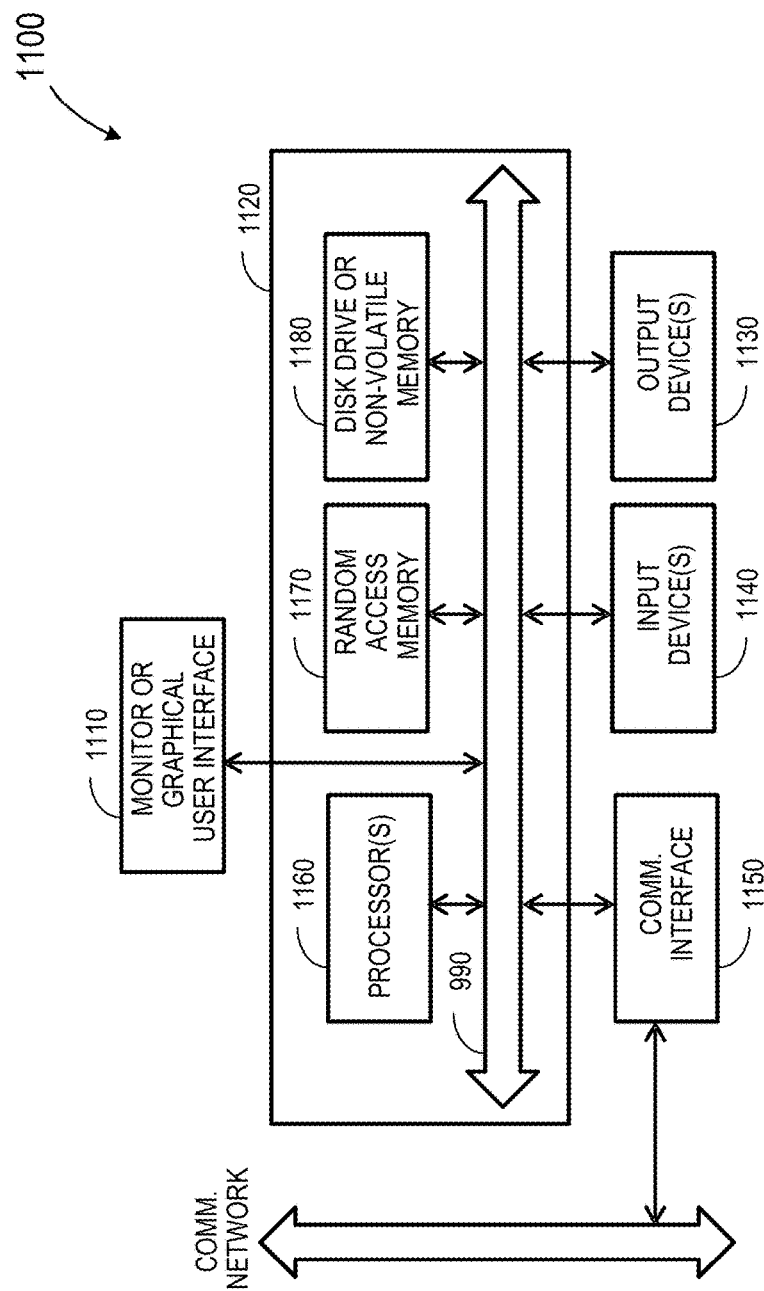
FIG. 11 is a simplified block diagram illustrating an apparatus that may be used to implement various embodiments according to the present disclosure.

FIG. 11 is a simplified block diagram illustrating an apparatus that may be used to implement various embodiments according the present disclosure. FIG. 11 is merely illustrative of an embodiment incorporating the present disclosure and does not limit the scope of the disclosure as recited in the claims. One of ordinary skill in the art would recognize other variations, modifications, and alternatives. In one embodiment, computer system 1100 typically includes a monitor 1110, a computer 1120, user output devices 1130, user input devices 1140, communications interface 1150, and the like.

As shown in FIG. 11, computer 1120 may include a processor(s) 1160 that communicates with a number of peripheral devices via a bus subsystem 1190. These peripheral devices may include user output devices 1130, user input devices 1140, communications interface 1150, and a storage subsystem, such as random access memory (RAM) 1170 and disk drive 1180.

User input devices 1140 can include all possible types of devices and mechanisms for inputting information to computer system 1120. These may include a keyboard, a keypad, a touch screen incorporated into the display, audio input devices such as voice recognition systems, microphones, and other types of input devices. In various embodiments, user input devices 1140 are typically embodied as a computer mouse, a trackball, a track pad, a joystick, wireless remote, drawing tablet, voice command system, eye tracking system, and the like. User input devices 1140 typically allow a user to select objects, icons, text and the like that appear on the monitor 1110 via a command such as a click of a button or the like.

User output devices 1130 include all possible types of devices and mechanisms for outputting information from computer 1120. These may include a display (e.g., monitor 1110), non-visual displays such as audio output devices, etc.

Communications interface 1150 provides an interface to other communication networks and devices. Communications interface 1150 may serve as an interface for receiving data from and transmitting data to other systems. Embodiments of communications interface 1150 typically include an Ethernet card, a modem (telephone, satellite, cable, ISDN), (asynchronous) digital subscriber line (DSL) unit, FireWire interface, USB interface, and the like. For example, communications interface 1150 may be coupled to a computer network, to a FireWire bus, or the like. In other embodiments, communications interfaces 1150 may be physically integrated on the motherboard of computer 1120, and may be a software program, such as soft DSL, or the like.

In various embodiments, computer system 1100 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, computer 1120 includes one or more Xeon microprocessors from Intel as processor(s) 1160. Further, in one embodiment, computer 1120 includes a UNIX-based operating system.

RAM 1170 and disk drive 1180 are examples of tangible storage media configured to store data such as embodiments of the present disclosure, including executable computer code, human readable code, or the like. Other types of tangible storage media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 1170 and disk drive 1180 may be configured to store the basic programming and data constructs that provide the functionality of the present disclosure.

Software code modules and instructions that provide the functionality of the present disclosure may be stored in RAM 1170 and disk drive 1180. These software modules may be executed by processor(s) 1160. RAM 1170 and disk drive 1180 may also provide a repository for storing data used in accordance with the present disclosure.

RAM 1170 and disk drive 1180 may include a number of memories including a main random access memory (RAM) for storage of instructions and data during program execution and a read only memory (ROM) in which fixed non-transitory instructions are stored. RAM 1170 and disk drive 1180 may include a file storage subsystem providing persistent (non-volatile) storage for program and data files. RAM 1170 and disk drive 1180 may also include removable storage systems, such as removable flash memory.

Bus subsystem 1190 provides a mechanism for letting the various components and subsystems of computer 1120 communicate with each other as intended. Although bus subsystem 1190 is shown schematically as a single bus, alternative embodiments of the bus subsystem may utilize multiple busses.

FIG. 11 is representative of a computer system capable of embodying the present disclosure. It will be readily apparent to one of ordinary skill in the art that many other hardware and software configurations are suitable for use with the present disclosure. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A decoding apparatus configured for decoding a plurality of codewords in parallel, comprising:
   a memory;
   a processor coupled to the memory, the processor configured to read encoded data including a plurality of codewords from the memory, the plurality of codewords being encoded in a product code in which each codeword has multiple data blocks, each data block having a number of data bits, wherein the plurality of codewords are encoded such that codewords belonging to a same pair of codewords share a common data block; and
   one or more decoders, configured to perform parallel decoding of two codewords, wherein decoding of one of the two codewords at least partially overlaps in time with decoding of the other one of the two codewords;
   wherein the decoding apparatus is configured to:
      perform parallel decoding of a first codeword and a second codeword sharing a common data block to determine error information associated with each codeword, wherein the error information identifies one or more data blocks having one or more errors and associated error bit patterns;
      update the first codeword based on the error information indicating an error;
      if the error information indicates an error in the decoding of the second codeword, determine whether to update the second codeword as follows:
         determine if the common data block between the first codeword and the second codeword has been identified as having an error in the decoding of the first codeword;
         upon determining that the common data block has not been identified as having an error, update the second codeword based on the error information;
         upon determining that the common data block has been identified as having an error and that an error bit pattern in the common data block identified in the decoding of the second codeword is the same as an error bit pattern in the common data block identified from the error information based on the decoding of the first codeword, update data blocks other than the common data block in the second codeword without updating the common data block; and
         upon determining that the common data block has been identified as having an error and that the error bit pattern in the common data block identified in the decoding of the second codeword is different from the error bit pattern in the common data block identified from the error information based on the decoding of the first codeword, skip the updating of the second codeword.

2. The apparatus of claim 1, wherein the apparatus is further configured to perform sequential decoding, in which the codewords are decoded sequentially, wherein the apparatus is configured to perform sequential decoding only if it is determined that the parallel decoding has failed to decode the plurality of codewords.

3. The apparatus of claim 1, wherein the parallel decoding is repeated until the plurality of codewords are successfully decoded or until a predetermined number of iterations has been reached.

4. The apparatus of claim 1, wherein the parallel decoding is performed by a single decoder with a pipeline structure.

5. The apparatus of claim 1, wherein the parallel decoding is performed by two or more decoders.

6. The apparatus of claim 1, wherein the plurality of codewords are encoded in the product code by arranging a plurality of data blocks in a triangular matrix of N columns by N rows, N being an integer, such that column 1 comprises one data block, column 2 comprises two data blocks, . . . , column N comprises N data blocks, and that row 1 comprises N data blocks, row 2 comprises N−1 data blocks, . . . , row N comprises one data block, and
   wherein the codewords are formed such that:
      codeword 1 comprises N data blocks in row 1;
      codeword 2 comprises one data block in column 1 and N−1 data blocks in row 2;
      codeword 3 comprise two data blocks of column 2, and N−2 data blocks in row 3;
      codeword 4 comprise three data blocks of column 3, and N−3 data blocks in row 4;
      . . . ;
      codeword N−1 comprises N−2 data blocks of column N−2 and two data blocks in row N−1;
      codeword N comprises N−1 data blocks of column N−1 and one data block in row N;
   or the codewords are formed as described above, with rows and columns reversed;
   whereby each data block is included in two codewords.

7. The apparatus of claim 1, wherein:
   the encoded data comprises a group of data bits arranged in data blocks, the data blocks including blocks of information bits;

each codeword including a number of data blocks and parity bits, the parity bits formed by encoding the data blocks using an error-correcting coding scheme;

the encoded data further including parity-on-parity (POP) bits, which are formed by encoding the parity bits of the codewords using a second error-correcting coding scheme;

wherein each data block is included in two or more codewords, and wherein codewords belonging to a same pair of codewords share a common data block.

8. The apparatus of claim 7, wherein the apparatus is configured to:

decode the plurality of codewords, wherein, in each parallel decoding operation, two or more codewords are decoded in parallel, and a codeword is updated to correct errors unless a shared common data block is previously updated in said parallel decoding operation;

if the plurality of codewords are not decoded successfully, decode and update the parity bits and the POP bits; and repeat the above parallel decoding operations until all codewords are decoded successfully or until a preset number of iterations is reached and the parallel decoding operation is determined to be unsuccessful.

9. The apparatus of claim 8, wherein, if the parallel decoding operation is determined to be unsuccessful, a sequential decoding is performed, in which the apparatus is configured to:

decode the plurality of codewords, wherein each codeword is decoded sequentially and updated to correct errors;

if the plurality of codewords are not decoded successfully, decode and update the parity bits and the POP bits; and repeat the above decoding operations until all codewords are decoded successfully or until a preset number of iterations is reached.

10. A memory device, comprising:

a memory array;

a processor coupled to the memory array; and a decoding apparatus configured to perform parallel decoding of codewords, each of the codewords having a plurality of data blocks, each data block having a number of data bits, wherein the codewords are encoded such that codewords belonging to a same pair of codewords share a common data block;

wherein the decoding apparatus is configured to:

decode in parallel two or more codewords, wherein each pair of codewords shares a common data block, to determine error information associated with each codeword, wherein, for each error, the error information identifies a data blocks having the error and associated error bit pattern; and update the two or more codewords based on the identified one or more data blocks having errors and the associated error bit patterns.

11. The memory device of claim 10, wherein the decoding apparatus is configured to:

update a first codeword according to the error information; and update a second codeword according to the error information associated with the second codeword, unless the common data block is updated in the updating of the first codeword and the error bit pattern in the common data block identified in the decoding of the second codeword is different from the error bit pattern in the common data block identified in the decoding of the first codeword.

12. The memory device of claim 10, wherein the decoding apparatus is configured to decode a plurality of codewords that are encoded in a product code in which each codeword has multiple blocks of data bits, wherein codewords belonging to a same pair of codewords share a common data block.

13. The memory device of claim 12, wherein the decoding apparatus is configured to decode encoded data, wherein:

the encoded data includes codewords, each codeword having a number of data blocks and parity bits, the parity bits being formed by encoding the data blocks using a first error-correcting coding scheme;

the encoded data further includes parity-on-parity (POP) bits, which are formed by encoding the parity bits of the codewords using a second error-correcting coding scheme; and wherein codewords belonging to a same pair of codewords share a common data block.

14. The memory device of claim 13, wherein, in the parallel decoding, the apparatus is configured to:

decode the plurality of codewords, and if the plurality of codewords are not decoded successfully, decode and update the parity bits and the POP bits; and repeat above decoding operations until all codewords are decoded successfully or until a preset number of iterations is reached and the parallel decoding is determined to be unsuccessful.

15. The memory device of claim 13, if the parallel decoding is determined to be unsuccessful, a sequential decoding is performed, in which the apparatus is configured to:

decode the plurality of codewords, wherein each codeword is decoded sequentially, and the codeword is updated to correct errors;

if the plurality of codewords are not decoded successfully, decode and update the parity bits and the POP bits; and repeat above decoding operations until all codewords are decoded successfully or until a preset number of iterations is reached.

16. A method for decoding data, the method comprising:

reading, from a memory, encoded data including a plurality of codewords, each codeword having multiple data blocks, each data block including a number of data bits, wherein the plurality of codewords are encoded such that codewords belonging to a same pair of codewords share a common data block;

decoding, in parallel, a first codeword and a second codeword that share a common data block to determine error information associated with each codeword, wherein the decoding of the first codeword at least partially overlaps in time with the decoding of the second codeword, and wherein, for each error, the error information identifies a data block having the error and associated error bit pattern; and updating the codewords based on the error information associated with the common data block.

17. The method of claim 16, further comprising:

updating the first codeword according to the error information associated with the first codeword;

updating the second codeword according to the error information associated with the second codeword, unless the common data block is updated in the updating of the first codeword and the error bit pattern in the common data block identified in the decoding of the second codeword is different from the error bit pattern in the common data block identified in the decoding of the first codeword.

18. The method of claim 16, wherein:
the encoded data includes codewords, each codeword having a number of data blocks and parity bits, the parity bits being formed by encoding the data blocks using a first error-correcting coding scheme;
the encoded data further includes parity-on-parity (POP) bits, which are formed by encoding the parity bits of the codewords using a second error-correcting coding scheme;
wherein each data block is included in two or more codewords, and codewords belonging to a same pair of codewords share a common data block.

19. The method of claim 18, further comprising:
in parallel decoding, performing parallel decoding of the plurality of codewords; and
if the parallel decoding is unsuccessful, performing sequential decoding in which the codewords are decoded sequentially.

20. The method of claim 19, further comprising, in the parallel decoding:
decoding the plurality of codewords;
if the plurality of codewords are not decoded successfully, decoding and updating the parity bits and the POP bits; and
repeating the above decoding operations until all codewords are decoded successfully or until a preset number of iterations is reached.

* * * * *